United States Patent
Chen et al.

(10) Patent No.: US 12,134,690 B2
(45) Date of Patent: Nov. 5, 2024

(54) PHOTORESIST COMPOSITION AND METHOD OF MANUFACTURING A SEMICONDUCTOR DEVICE

(71) Applicant: TAIWAN SEMICONDUCTOR MANUFACTURING CO., LTD., Hsinchu (TW)

(72) Inventors: Yen-Hao Chen, New Taipei (TW); Wei-Han Lai, New Taipei (TW); Ching-Yu Chang, Yuansun Village (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 230 days.

(21) Appl. No.: 17/098,298

(22) Filed: Nov. 13, 2020

(65) Prior Publication Data

US 2021/0198468 A1   Jul. 1, 2021

Related U.S. Application Data

(60) Provisional application No. 62/956,007, filed on Dec. 31, 2019.

(51) Int. Cl.
  *G03F 7/004* (2006.01)
  *C08L 25/14* (2006.01)
  (Continued)

(52) U.S. Cl.
  CPC .............. *C08L 25/14* (2013.01); *C08L 33/08* (2013.01); *C08L 33/14* (2013.01); *G03F 7/0045* (2013.01);
  (Continued)

(58) Field of Classification Search
  None
  See application file for complete search history.

(56) References Cited

U.S. PATENT DOCUMENTS 8,796,666 B1   8/2014   Huang et al.
9,093,530 B2   7/2015   Huang et al.
(Continued)

FOREIGN PATENT DOCUMENTS

CN   103926796 A   7/2014
CN   105051607 A   11/2015
(Continued)

*Primary Examiner* — Martin J Angebranndt
(74) *Attorney, Agent, or Firm* — STUDEBAKER & BRACKETT PC

(57) ABSTRACT

Method of manufacturing semiconductor device includes forming photoresist layer over substrate. Photoresist layer is selectively exposed to radiation, and selectively exposed photoresist layer developed. Photoresist composition includes photoactive compound, crosslinker, copolymer. The copolymer is

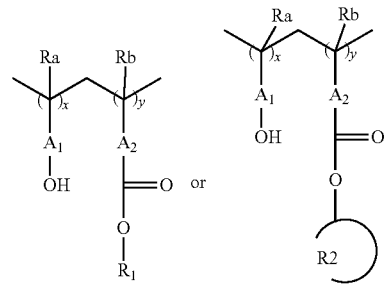

A1 and A2 are independently direct link, C6-C15 phenyl group, C7-C15 benzyl group, C1-C15 alkyl group,
(Continued)

C3-C15 cycloalkyl group, C1-C15 hydroxyalkyl group, C2-C15 alkoxy group, C3-C15 alkoxy alkyl group, C2-C15 acetyl group, C3-C15 acetyl alkyl group, C1-C15 carboxyl group, C2-C15 alkyl carboxyl group, C4-C15 cycloalkyl carboxyl group, C3-C15 saturated or unsaturated hydrocarbon ring, C2-C15 hetero chain, C3-C15 heterocyclic ring, or three dimensional ring structure; R1 is thermal or acid labile group including C4-C15 alkyl, cycloalkyl, hydroxyalkyl, alkoxy, or alkoxy alkyl group, or three dimensional ring structure; R2 is substituted or unsubstituted C4-C10 cycloalkyl group; Ra and Rb are independently H or $CH_3$; and $0<x/(x+y)<1$ and $0<y/(x+y)<1$.

20 Claims, 17 Drawing Sheets

(51) Int. Cl.
  *C08L 33/08* (2006.01)
  *C08L 33/14* (2006.01)
  *G03F 7/038* (2006.01)
  *G03F 7/20* (2006.01)
  *G03F 7/40* (2006.01)

(52) U.S. Cl.
  CPC .......... *G03F 7/0382* (2013.01); *G03F 7/2004* (2013.01); *G03F 7/40* (2013.01)

(56) References Cited

U.S. PATENT DOCUMENTS

| | | | |
|---|---|---|---|
| 9,213,234 B2 | 12/2015 | Chang | |
| 9,223,220 B2 | 12/2015 | Chang | |
| 9,256,133 B2 | 2/2016 | Chang | |
| 9,536,759 B2 | 1/2017 | Yang et al. | |
| 9,548,303 B2 | 1/2017 | Lee et al. | |
| 9,857,684 B2 | 1/2018 | Lin et al. | |
| 9,859,206 B2 | 1/2018 | Yu et al. | |
| 9,875,892 B2 | 1/2018 | Chang et al. | |
| 10,261,416 B2 | 4/2019 | Yamada et al. | |
| 10,534,262 B2 | 1/2020 | Hirano et al. | |
| 11,292,764 B2 | 4/2022 | Zhang et al. | |
| 11,300,878 B2 | 4/2022 | Zi et al. | |
| 2001/0023050 A1* | 9/2001 | Numata | G03F 7/0045 430/326 |
| 2002/0058197 A1 | 5/2002 | Nozaki et al. | |
| 2002/0061462 A1* | 5/2002 | Uenishi | G03F 7/0048 430/296 |
| 2003/0027061 A1* | 2/2003 | Cameron | C07C 381/12 430/326 |
| 2003/0099900 A1* | 5/2003 | Yamada | G03F 7/0045 430/905 |
| 2003/0194640 A1 | 10/2003 | Sato | |
| 2005/0048395 A1* | 3/2005 | Kobayashi | C07D 317/72 430/141 |
| 2005/0277055 A1* | 12/2005 | Kon | G03F 7/093 430/270.1 |
| 2006/0216635 A1* | 9/2006 | Hirano | G03F 7/0397 430/270.1 |
| 2010/0230136 A1* | 9/2010 | Ichikawa | G03F 7/0035 174/250 |
| 2014/0186773 A1 | 7/2014 | Chang | |
| 2015/0198881 A1* | 7/2015 | Nagamine | C08F 220/385 560/201 |
| 2015/0355550 A1 | 12/2015 | Furukawa | |
| 2016/0004157 A1 | 1/2016 | Ito et al. | |
| 2016/0209747 A1 | 7/2016 | Yamaguchi | |
| 2016/0320699 A1 | 11/2016 | Yamada et al. | |

FOREIGN PATENT DOCUMENTS

| | | | |
|---|---|---|---|
| CN | 106094450 A | 11/2016 | |
| CN | 106610566 A | 5/2017 | |
| CN | 109782553 A | 5/2019 | |
| CN | 111819495 A | 10/2020 | |
| EP | 1705518 A2 * | 9/2006 | .......... G03F 7/0045 |
| JP | 09166870 A * | 6/1997 | |
| JP | 2001109142 A | 4/2001 | |
| JP | 2001142200 A * | 5/2001 | |
| JP | 2003233191 A * | 8/2003 | |
| JP | 2004020735 A | 1/2004 | |
| JP | 2009251392 A | 10/2009 | |
| JP | 2010159399 A * | 7/2010 | |
| JP | 2013029623 A * | 2/2013 | |
| JP | 2015143819 A * | 8/2015 | |
| JP | 2016057632 A * | 4/2016 | |
| TW | 201337463 A | 9/2013 | |
| TW | 201500853 A | 1/2015 | |
| TW | 201523134 A | 6/2015 | |
| TW | 201523140 A | 6/2015 | |
| TW | 201825533 A | 7/2018 | |
| TW | 201918803 A | 5/2019 | |
| TW | 201940465 A1 | 10/2019 | |
| WO | WO-2015045876 A1 * | 4/2015 | .............. G03F 1/00 |

* cited by examiner

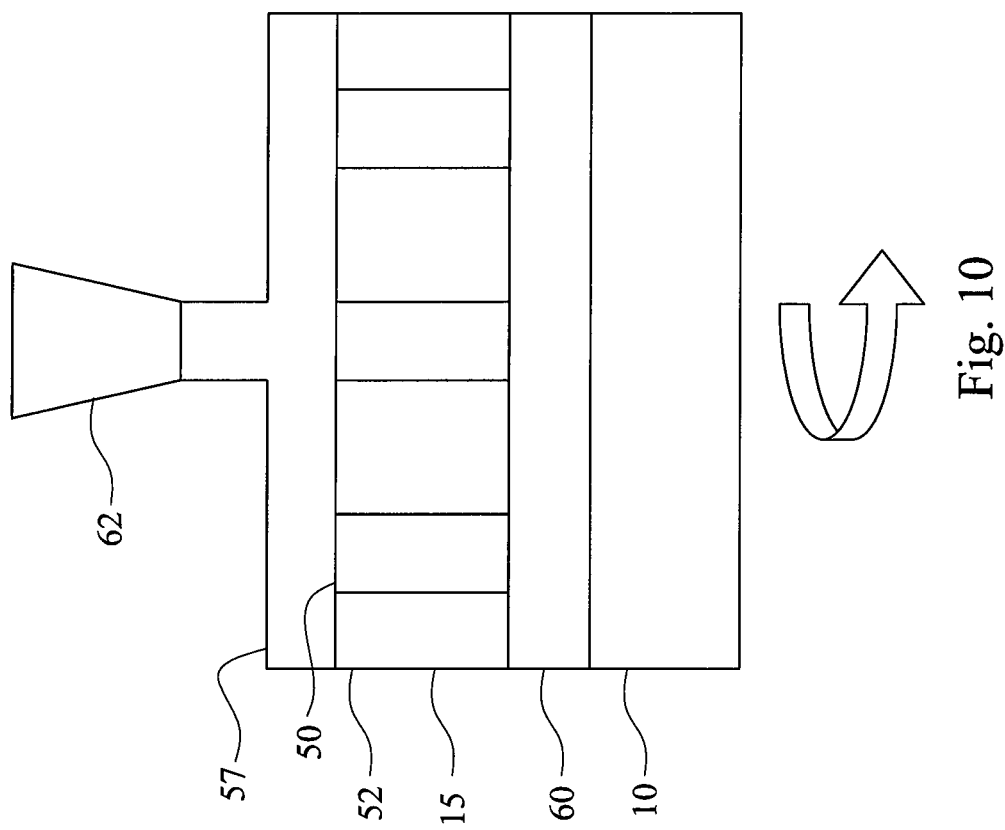

PHOTORESIST COMPOSITION AND METHOD OF MANUFACTURING A SEMICONDUCTOR DEVICE

CROSS-REFERENCE TO RELATED APPLICATION

This application claims priority to U.S. Provisional Patent Application No. 62/956,007, filed Dec. 31, 2019, the entire disclosure of which is incorporated herein by reference.

BACKGROUND

As consumer devices have gotten smaller and smaller in response to consumer demand, the individual components of these devices have necessarily decreased in size as well. Semiconductor devices, which make up a major component of devices such as mobile phones, computer tablets, and the like, have been pressured to become smaller and smaller, with a corresponding pressure on the individual devices (e.g., transistors, resistors, capacitors, etc.) within the semiconductor devices to also be reduced in size.

One enabling technology that is used in the manufacturing processes of semiconductor devices is the use of photolithographic materials. Such materials are applied to a surface of a layer to be patterned and then exposed to an energy that has itself been patterned. Such an exposure modifies the chemical and physical properties of the exposed regions of the photosensitive material. This modification, along with the lack of modification in regions of the photosensitive material that were not exposed, can be exploited to remove one region without removing the other.

However, as the size of individual devices has decreased, process windows for photolithographic processing has become tighter and tighter. As such, advances in the field of photolithographic processing are necessary to maintain the ability to scale down the devices, and further improvements are needed in order to meet the desired design criteria such that the march towards smaller and smaller components may be maintained.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 10 shows a process stage of a sequential operation according to an embodiment of the disclosure.

DETAILED DESCRIPTION

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

Figure 1:
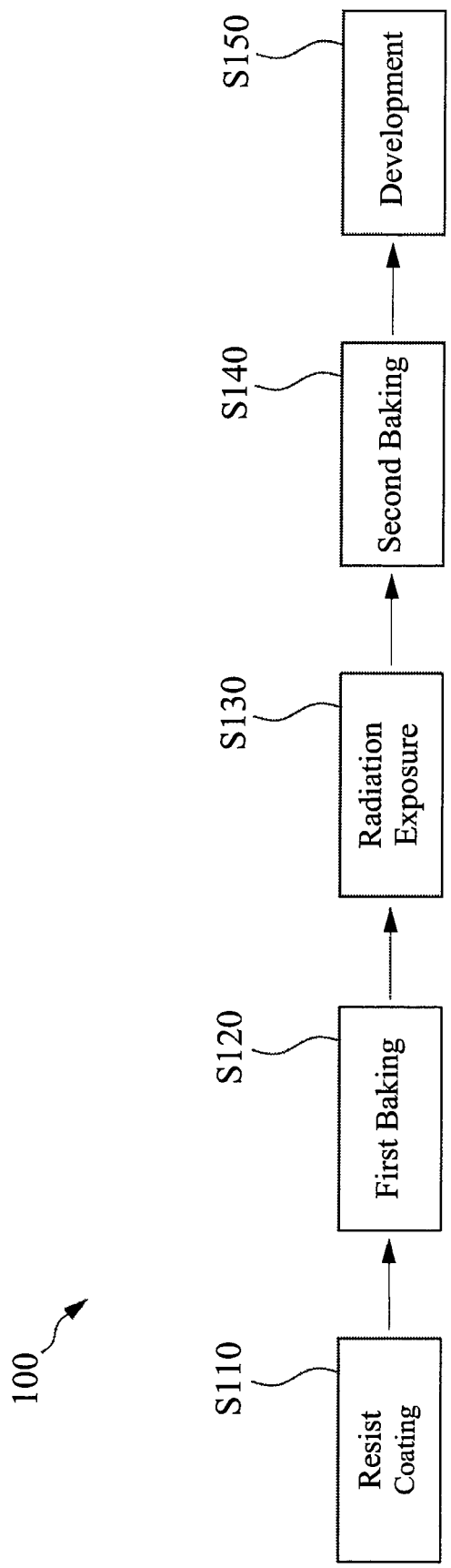
FIG. 1 illustrates a process flow of manufacturing a semiconductor device according to embodiments of the disclosure.
Figure 2:
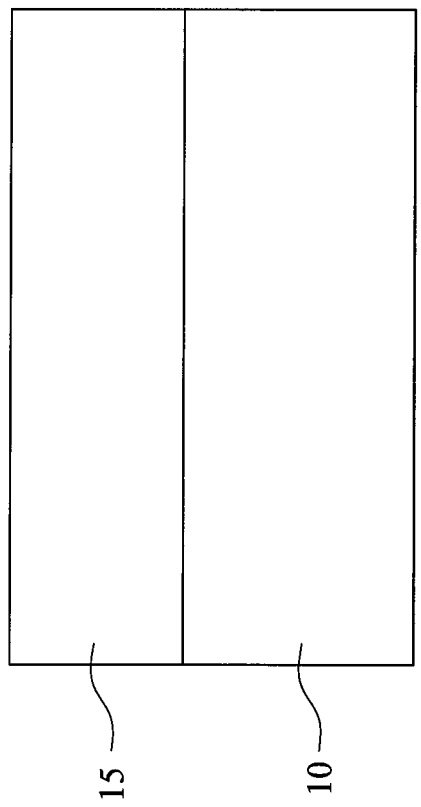
FIG. 2 shows a process stage of a sequential operation according to an embodiment of the disclosure.

FIG. 1 illustrates a process flow 100 of manufacturing a semiconductor device according to embodiments of the disclosure. A resist is coated on a surface of a layer to be patterned or a substrate 10 in operation S110, in some embodiments, to form a resist layer 15, as shown in FIG. 2. In some embodiments, the resist layer 15 is a photoresist layer. Then the resist layer 15 undergoes a first baking operation S120 (or pre-baking operation) to evaporate solvents in the resist composition in some embodiments. The resist layer 15 is baked at a temperature and time sufficient to cure and dry the photoresist layer 15. In some embodiments, the resist layer is heated at a temperature of about 40° C. to 130° C. for about 10 seconds to about 10 minutes.

After the first (or pre-) baking operation S120, the photoresist layer 15 is selectively exposed to actinic radiation 45/97 (see FIGS. 3A and 3B) in operation S130. In some embodiments, the photoresist layer 15 is selectively exposed to ultraviolet radiation. In some embodiments, the ultraviolet radiation is deep ultraviolet radiation (DUV). In some embodiments, the ultraviolet radiation is extreme ultraviolet (EUV) radiation. In some embodiments, the actinic radiation is an electron beam.

Figure 3A:
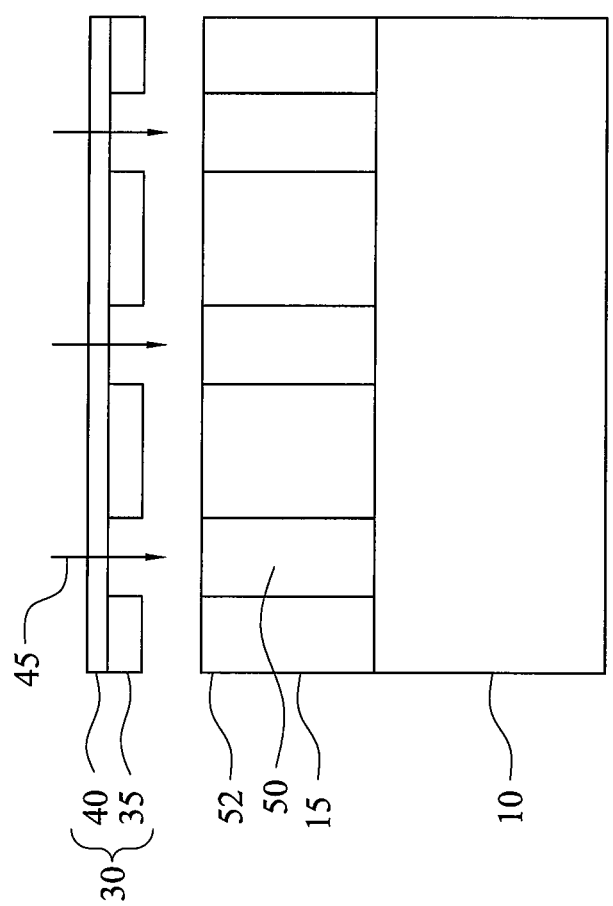
FIGS. 3A and 3B show a process stage of a sequential operation according to embodiments of the disclosure.

As shown in FIG. 3A, the exposure radiation 45 passes through a photomask 30 before irradiating the photoresist layer 15 in some embodiments. In some embodiments, the photomask has a pattern to be replicated in the photoresist layer 15. The pattern is formed by an opaque pattern 35 on the photomask substrate 40, in some embodiments. The opaque pattern 35 may be formed by a material opaque to ultraviolet radiation, such as chromium, while the photomask substrate 40 is formed of a material that is transparent to ultraviolet radiation, such as fused quartz.

Figure 3B:
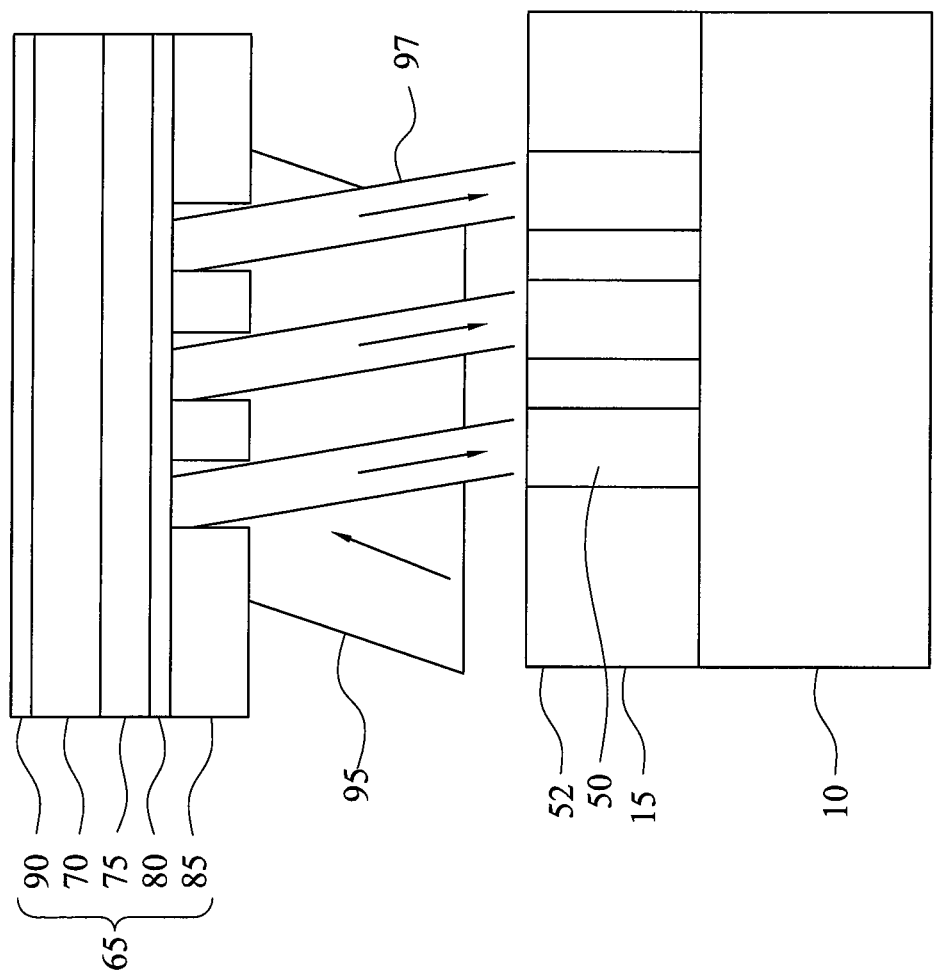

In some embodiments, the selective exposure of the photoresist layer 15 to form exposed regions 50 and unexposed regions 52 is performed using extreme ultraviolet lithography. In an extreme ultraviolet lithography operation a reflective photomask 65 is used to form the patterned exposure light in some embodiments, as shown in FIG. 3B. The reflective photomask 65 includes a low thermal expansion glass substrate 70, on which a reflective multilayer 75 of Si and Mo is formed. A capping layer 80 and absorber layer 85 are formed on the reflective multilayer 75. A rear conductive layer 90 is formed on the back side of the low thermal expansion substrate 70. In extreme ultraviolet lithography, extreme ultraviolet radiation 95 is directed towards the reflective photomask 65 at an incident angle of about 6°. A portion 97 of the extreme ultraviolet radiation is reflected by the Si/Mo multilayer 75 towards the photoresist coated substrate 10, while the portion of the extreme ultraviolet radiation incident upon the absorber layer 85 is absorbed by the photomask. In some embodiments, additional optics, including mirrors, are between the reflective photomask 65 and the photoresist coated substrate.

The region 50 of the photoresist layer exposed to radiation 45 undergoes a chemical reaction thereby changing its solubility in a subsequently applied developer relative to the region 52 of the photoresist layer not exposed to radiation 45. In some embodiments, the region 50 of the photoresist layer exposed to radiation 45 undergoes a crosslinking reaction.

Next, the photoresist layer 15 undergoes a second baking (or post-exposure bake) in operation S140. In some embodiments, the photoresist layer 15 is heated at a temperature of about 50° C. to 160° C. for about 20 seconds to about 120 seconds. The post-exposure baking may be used in order to assist in the generating, dispersing, and reacting of the acid/base/free radical generated from the impingement of the radiation 45 upon the photoresist layer 15 during the exposure. Such assistance helps to create or enhance chemical reactions, which generate chemical differences between the exposed region 50 and the unexposed region 52 within the photoresist layer. The post-exposure baking also stimulates thermal reactions in the unexposed regions 52 within the resist layer to improve the solubility of the unexposed regions in the developer. These chemical differences cause differences in the solubility between the exposed region 50 and the unexposed region 52.

Figure 4:
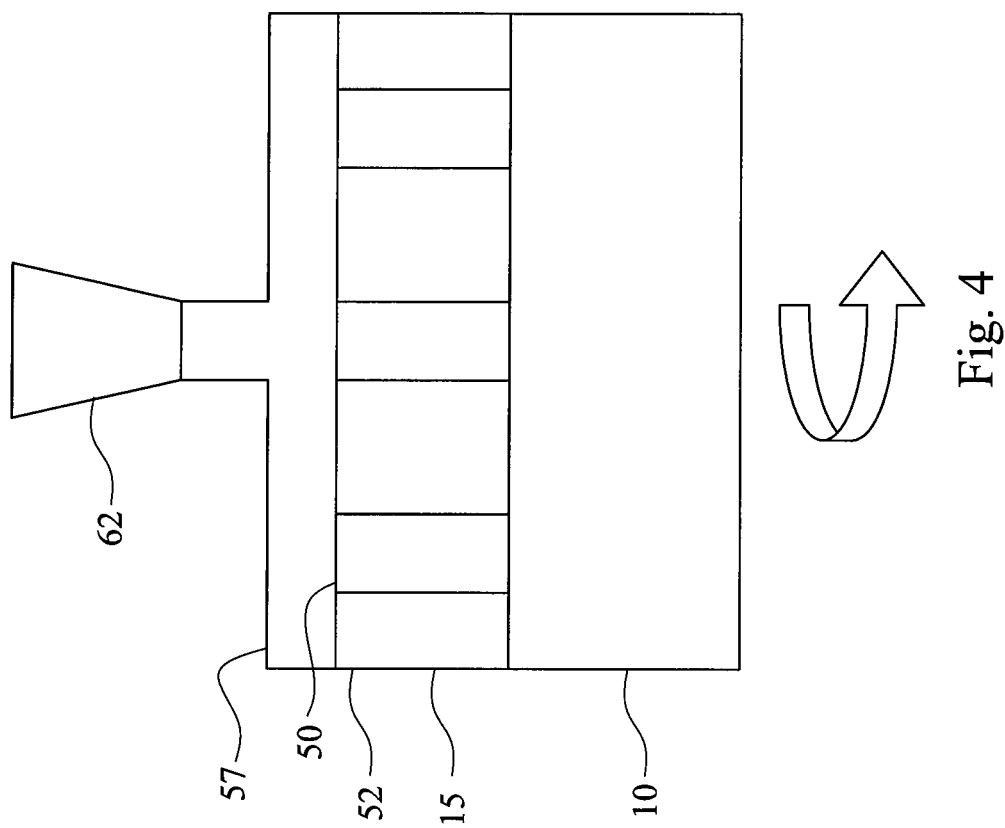
FIG. 4 shows a process stage of a sequential operation according to an embodiment of the disclosure.
Figure 5:
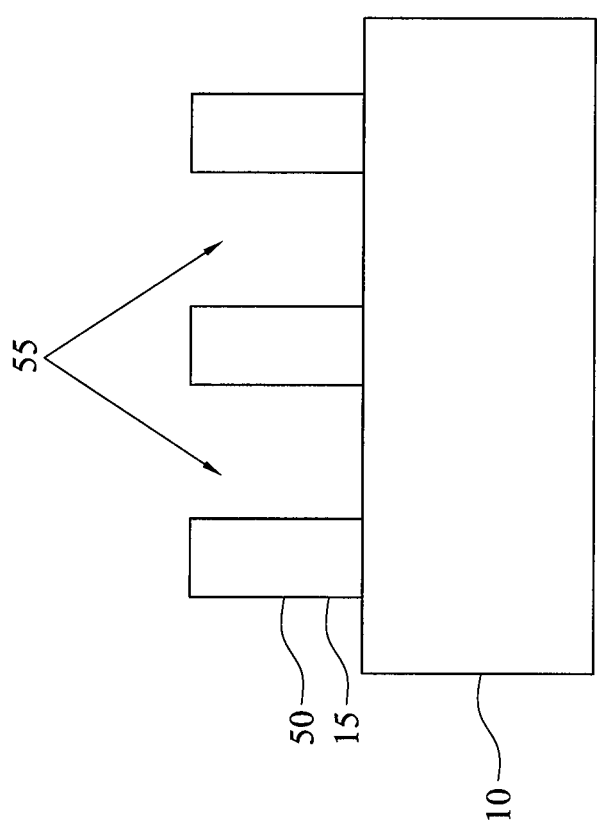
FIG. 5 shows a process stage of a sequential operation according to an embodiment of the disclosure.

The selectively exposed photoresist layer is subsequently developed by applying a developer to the selectively exposed photoresist layer in operation S150. As shown in FIG. 4, a developer 57 is supplied from a dispenser 62 to the photoresist layer 15. In some embodiments, the unexposed region 52 of the photoresist layer is removed by the developer 57 forming a pattern of openings 55 in the photoresist layer 15 to expose the substrate 10, as shown in FIG. 5.

Figure 6:
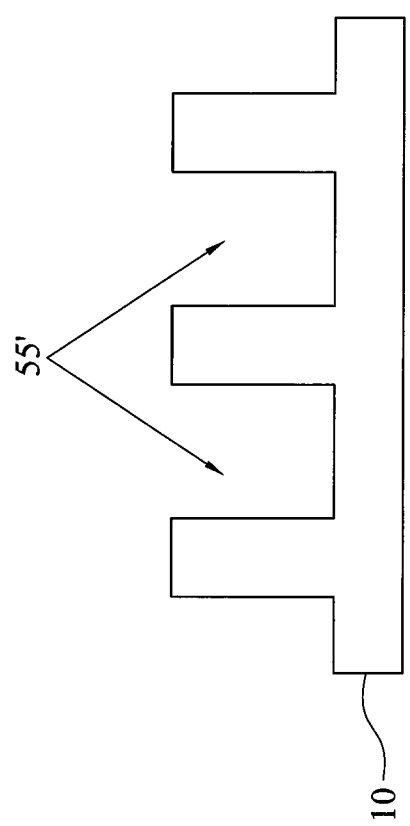
FIG. 6 shows a process stage of a sequential operation according to an embodiment of the disclosure.

In some embodiments, the pattern of openings 55 in the photoresist layer 15 are extended into the layer to be patterned or substrate 10 to create a pattern of openings 55' in the substrate 10, thereby transferring the pattern in the photoresist layer 15 into the substrate 10, as shown in FIG. 6. The pattern is extended into the substrate by etching, using one or more suitable etchants. The exposed photoresist layer 15 is at least partially removed during the etching operation in some embodiments. In other embodiments, the exposed photoresist layer 15 is removed after etching the substrate 10 by using a suitable photoresist stripper solvent or by a photoresist ashing operation.

In some embodiments, the substrate 10 includes a single crystalline semiconductor layer on at least its surface portion. The substrate 10 may include a single crystalline semiconductor material such as, but not limited to Si, Ge, SiGe, GaAs, InSb, GaP, GaSb, InAlAs, InGaAs, GaSbP, GaAsSb and InP. In some embodiments, the substrate 10 is a silicon layer of an SOI (silicon-on insulator) substrate. In certain embodiments, the substrate 10 is made of crystalline Si.

The substrate 10 may include in its surface region, one or more buffer layers (not shown). The buffer layers can serve to gradually change the lattice constant from that of the substrate to that of subsequently formed source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In an embodiment, the silicon germanium (SiGe) buffer layer is epitaxially grown on the silicon substrate 10. The germanium concentration of the SiGe buffer layers may increase from 30 atomic % for the bottom-most buffer layer to 70 atomic % for the top-most buffer layer.

In some embodiments, the substrate 10 includes one or more layers of at least one metal, metal alloy, and metal/nitride/sulfide/oxide/silicide having the formula $MX_a$, where M is a metal and X is N, S, Se, O, Si, and a is from about 0.4 to about 2.5. In some embodiments, the substrate 10 includes titanium, aluminum, cobalt, ruthenium, titanium nitride, tungsten nitride, tantalum nitride, and combinations thereof.

In some embodiments, the substrate 10 includes a dielectric having at least a silicon or metal oxide or nitride of the formula $MX_b$, where M is a metal or Si, X is N or O, and b ranges from about 0.4 to about 2.5. In some embodiments, the substrate 10 includes silicon dioxide, silicon nitride, aluminum oxide, hafnium oxide, lanthanum oxide, and combinations thereof.

In some embodiments, the photoresist layer 15 is a photosensitive layer that is patterned by exposure to actinic radiation. Typically, the chemical properties of the photoresist regions struck by incident radiation change in a manner that depends on the type of photoresist used. In some embodiments, the photoresist layer 15 is negative tone resists. Portions of the negative tone resist exposed to radiation becomes insoluble in the developer, while the region of the photoresist that is non-exposed (or exposed less) is soluble in the developer. The region of a negative resist that becomes insoluble upon exposure to radiation may become insoluble due to a cross-linking reaction caused by the exposure to radiation.

The developer is an aqueous-based developer, such as a tetramethylammonium hydroxide (TMAH) solution or an organic solvent. In some embodiments, the negative tone photoresist is developed with the TMAH solution. The unexposed regions of the photoresist are removed by the TMAH, and the exposed regions of the photoresist, that undergo cross-linking upon exposure to actinic radiation, remain on the substrate after development.

In some embodiments, the photoresist composition according to embodiments of the disclosure include a copolymer, wherein the copolymer includes a first repeating unit comprising pendant hydroxyl groups and a second repeating unit comprising a pendant ester group. In some embodiments, the pendant ester group is an acid labile group or a cycloalkyl group. In some embodiments, the cycloalkyl group is a C4-C10 heterocyclic cycloalkyl group.

In some embodiments, the copolymer is one of copolymer (I) or copolymer (II). In some embodiments, copolymers (I) and (II) each include two different repeating units (a and b) and (a' and b'), respectively. In some embodiments, the copolymers (I) and (II) are essentially made up of repeating units a, b, and a', b', respectively. Essentially made up of means about 95% or greater of the copolymer repeating units are a and b or a' and b', as shown below:

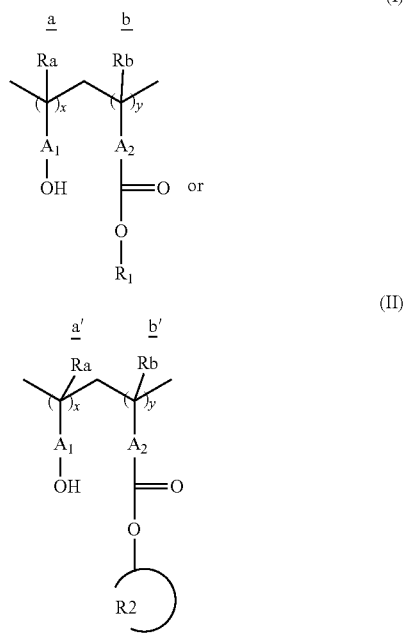

wherein A1 and A2 are independently a direct link, a C6-C15 phenyl group, a C7-C15 benzyl group, a C1-C15 alkyl group, a C3-C15 cycloalkyl group, a C1-C15 hydroxyalkyl group, a C2-C15 alkoxy group, a C3-C15 alkoxy alkyl group, a C2-C15 acetyl group, a C3-C15 acetyl alkyl group, a C1-C15 carboxyl group, a C2-C15 alkyl carboxyl group, a C4-C15 cycloalkyl carboxyl group, a C3-C15 saturated or unsaturated hydrocarbon ring, a C2-C15 hetero chain, a C3-C15 heterocyclic ring, a substituted or unsubstituted three dimensional ring structure. In some embodiments, R1 is thermal labile group or acid labile group including a substituted or unsubstituted C4-C15 alkyl, a C4-C15 cycloalkyl, a C4-C15 hydroxyalkyl, a C4-C15 alkoxy, a C4-C15 alkoxy alkyl group, or a substituted or unsubstituted three dimensional ring structure; and R2 is a substituted or unsubstituted C4-C10 cycloalkyl group. In some embodiments, the three dimensional ring structure is a substituted or unsubstituted adamantyl, cedryl, norbornyl, or tricyclodecanyl structure. In some embodiments, the C4-C10 cycloalkyl group is a heterocyclic group. In some embodiments, the heteroatom in the heterocyclic group is oxygen. In some embodiments, the C4-C10 cycloalkyl group is a lactone group. In some embodiments, the substituent group on the C4-C10 cycloalkyl is a C1-C4 alcohol group. In some embodiments, Ra and Rb are independently H or $CH_3$; and $0<x/(x+y)<1$ and $0<y/(x+y)<1$. In some embodiments, the R1 group is an alicyclic hydrocarbon group-containing group represented by the following formulas:

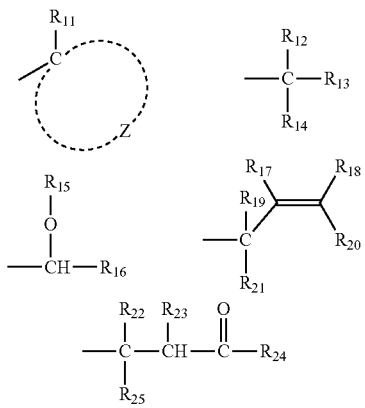

where $R_{11}$ is a methyl group, an ethyl group, an n-propyl group, an isopropyl group, an n-butyl group, an isobutyl group or a sec-butyl group; Z is an atomic group necessary to form an alicyclic hydrocarbon group together with an adjacent carbon atom; $R_{12}$, $R_{13}$, $R_{14}$, $R_{15}$, and $R_{16}$ are each independently a straight-chain or branched alkyl group having 1 to 4 carbon atoms or an alicyclic hydrocarbon group, provided that at least one of $R_{12}$, $R_{13}$, $R_{14}$, $R_{15}$, and $R_{16}$ is an alicyclic hydrocarbon group; $R_{17}$, $R_{18}$, $R_{19}$, $R_{20}$, and $R_{21}$ each independently represent a hydrogen atom, a straight-chain or branched alkyl group having 1 to 4 carbon atoms or an alicyclic hydrocarbon group, provided that at least one of $R_{17}$, $R_{18}$, $R_{19}$, $R_{20}$, and $R_{21}$ is an alicyclic hydrocarbon group and that at least one of $R_{19}$ and $R_{21}$ is a straight-chain or branched alkyl group having 1 to 4 carbon atoms or an alicyclic hydrocarbon group; and $R_{22}$, $R_{23}$, $R_{24}$, and $R_{25}$ are each independently a straight-chain or branched alkyl group having 1 to 4 carbon atoms or an alicyclic hydrocarbon group, provided that at least one of $R_{22}$, $R_{23}$, $R_{24}$, and $R_{25}$ is an alicyclic hydrocarbon group; and $R_{23}$ and $R_{24}$ may be connected together to form a ring.

Figure 7A:
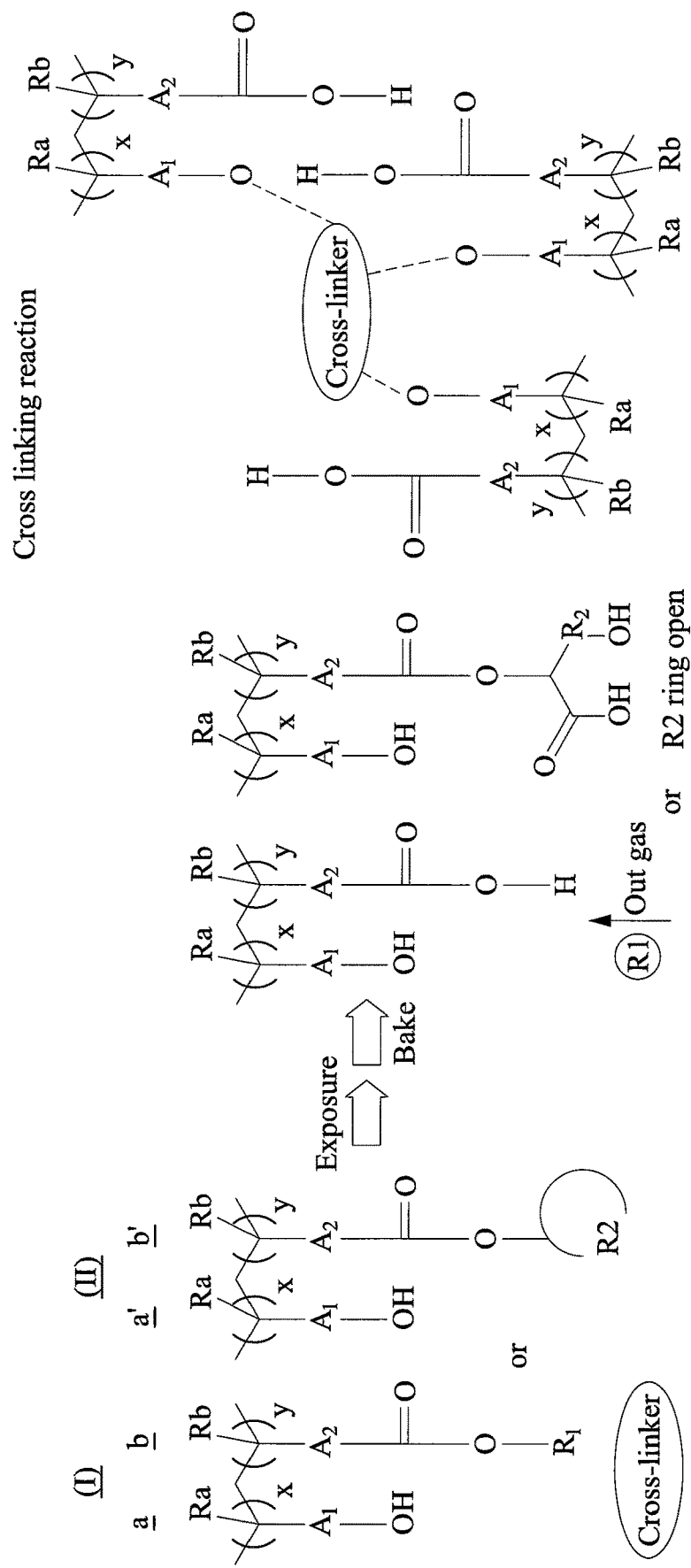
FIGS. 7A, 7B, 7C, 7D, 7E, 7F, and 7G show photoresist composition components according to some embodiments of the disclosure.

FIG. 7A illustrates components of the photoresist composition and reactions occurring during the photoresist patterning operations according to the present disclosure. During the post-exposure bake in the unexposed areas of the photoresist layer, cleavage of the R1 group or ring opening of the R2 groups occurs, forming COOH groups, as shown in FIG. 7A. The cleaved R1 group outgasses during the post-exposure baking. The COOH groups are more soluble in a tetramethyl ammonium hydroxide (TMAH) developer than OH groups. The increased solubility of the COOH groups provides improved developing and less residue or scum in the developed areas of the photoresist, thereby providing improved pattern definition and higher pattern resolution. Meanwhile, a cross-linking reaction occurs in the exposed areas of the photoresist layer.

Figure 7B:
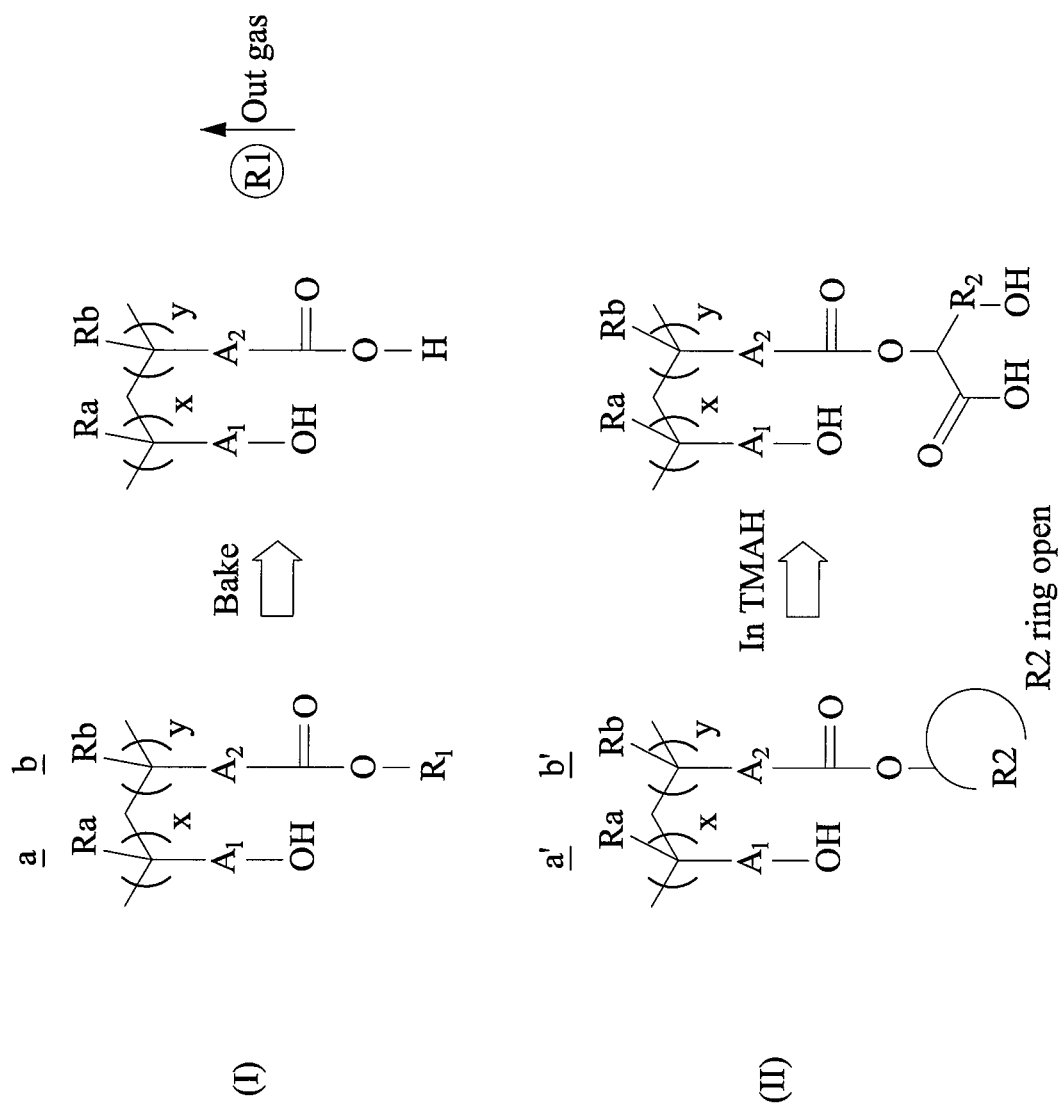

FIG. 7B illustrates two types of copolymers, (I) and (II), according to embodiments of the present disclosure. In copolymer (I), the R1 group is deprotected by the post-exposure baking operation. The -A2COOR1 group changes to a carboxylic acid -A2COOH, which has higher solubility in a TMAH developer. In copolymer (II), the R2 ring opens in some embodiments when the pH value is >10. Therefore, the TMAH developer can open the R2 ring and transform the -A2COOR2 group to a carboxylic group (-A2COOCH (COOH)R2OH), thereby increasing the solubility of the unexposed areas of the photoresist in the TMAH developer.

Figure 7E:
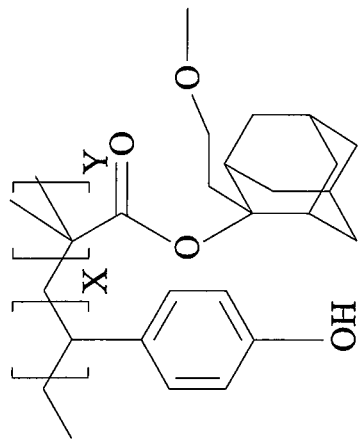
Figure 7F:
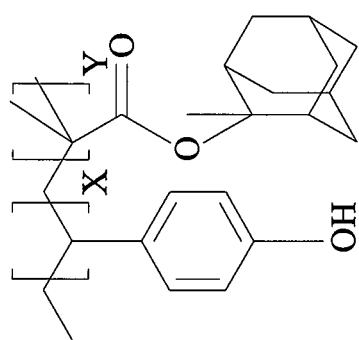
Figure 7D:
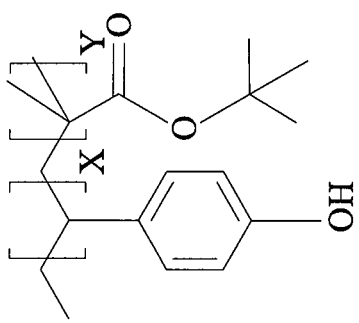
Figure 7C:
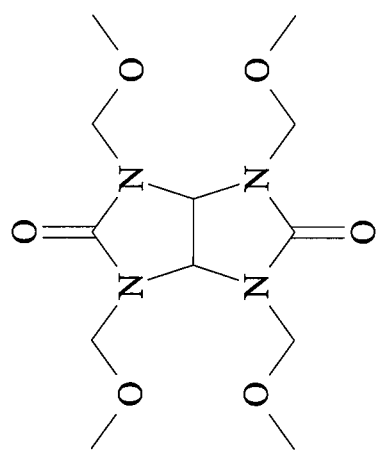

FIG. 7C illustrates an exemplary crosslinker according to embodiments of the present disclosure. This disclosure is not limited to this crosslinker, and other crosslinkers are within the scope of this disclosure.

FIGS. 7D, 7E, and 7F illustrate exemplary copolymers according to the present disclosure. In some embodiments, $0<x/(x+y)<1$, $0<y/(x+y)<1$. In some embodiments, the copolymers (I) and (II) are essentially made up of repeating units a, b, and a', b', respectively. The disclosure is not limited to these copolymers, and other copolymers are within the scope of this disclosure.

Figure 7G:
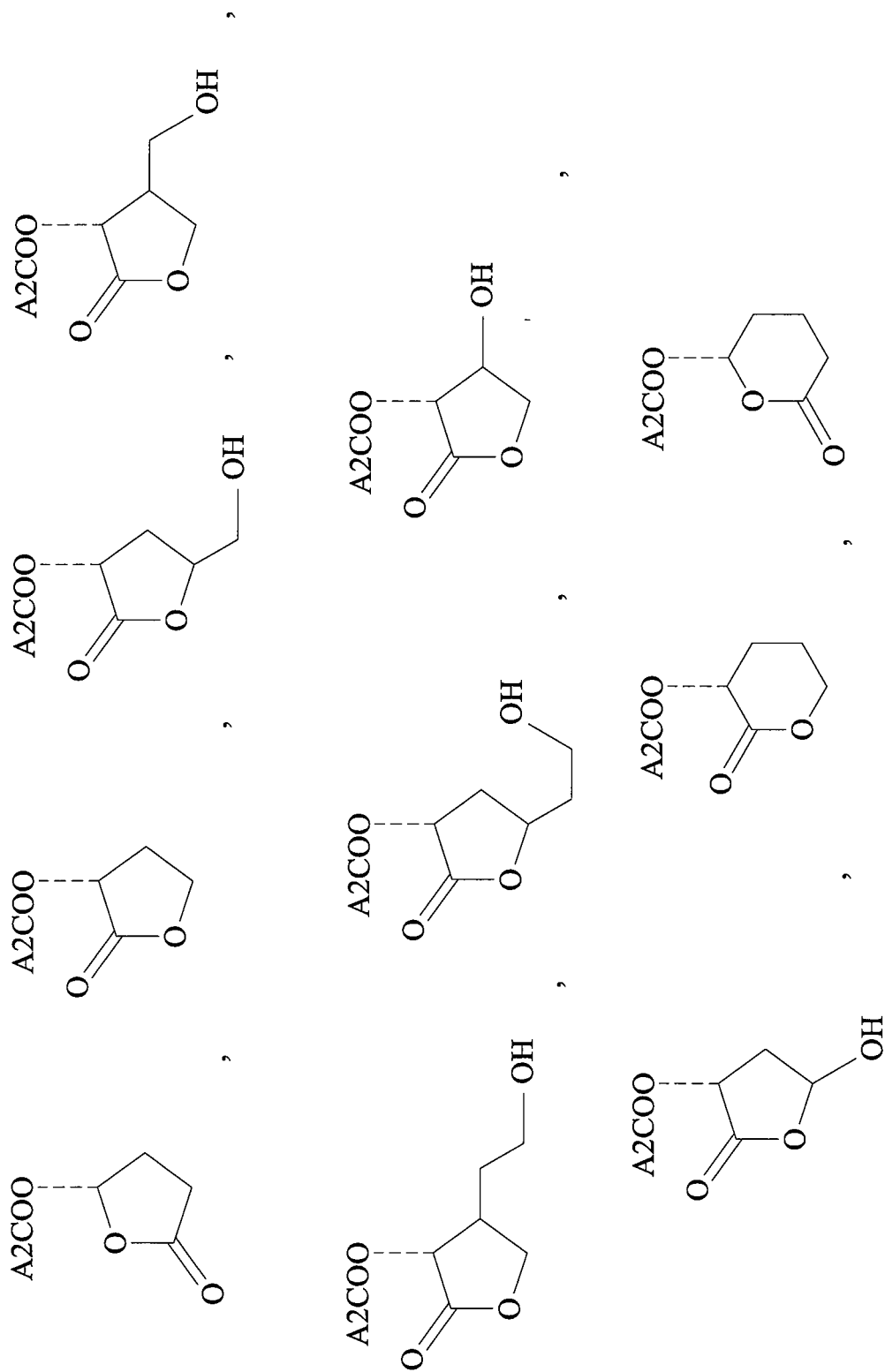

FIG. 7G illustrate exemplary R2 cycloalkyl groups according to embodiments of the present disclosure. As shown in FIG. 7G, the cycloalkyl are heterocyclic groups, such as lactones in some embodiments. As explained herein, A2 is a direct link, a C6-C15 phenyl group, a C7-C15 benzyl group, a C1-C15 alkyl group, a C3-C15 cycloalkyl group, a C1-C15 hydroxyalkyl group, a C2-C15 alkoxy group, a C3-C15 alkoxy alkyl group, a C2-C15 acetyl group, a C3-C15 acetyl alkyl group, a C1-C15 carboxyl group, a C2-C15 alkyl carboxyl group, a C4-C15 cycloalkyl carboxyl group, a C3-C15 saturated or unsaturated hydrocarbon ring, a C2-C15 hetero chain, a C3-C15 heterocyclic ring, a substituted or unsubstituted three dimensional ring structure. In some embodiments, the lactones are substituted by a C1-C4 alcohol group.

The inclusion of a lactone group to the copolymer structure assists in reducing the amount of line edge roughness after the photoresist has been developed, thereby helping to reduce the number of defects that occur during development. In some embodiments, the lactone groups include rings having five to seven members, although any suitable lactone structure may alternatively be used for the lactone group.

In some embodiments, such as when EUV radiation is used, the photoresist compositions according to the present disclosure are metal-containing resists. The metal-containing resists include metallic cores complexed with one or more ligands in a solvent. In some embodiments, the resist includes metal particles. In some embodiments, the metal particles are nanoparticles. As used herein, nanoparticles are particles having an average particle size between about 1 nm and about 20 nm. In some embodiments, the metallic cores, including from 1 to about 18 metal particles, are complexed with one or more organic ligands in a solvent. In some embodiments, the metallic cores include 3, 6, 9, or more metal nanoparticles complexed with one or more organic ligands in a solvent.

In some embodiments, the metal particle is one or more of titanium (Ti), zinc (Zn), zirconium (Zr), nickel (Ni), cobalt (Co), manganese (Mn), copper (Cu), iron (Fe), strontium (Sr), tungsten (W), vanadium (V), chromium (Cr), tin (Sn), hafnium (Hf), indium (In), cadmium (Cd), molybdenum (Mo), tantalum (Ta), niobium (Nb), aluminum (Al), cesium (Cs), barium (Ba), lanthanum (La), cerium (Ce), silver (Ag), antimony (Sb), combinations thereof, or oxides thereof. In some embodiments, the metal particles include one or more selected from the group consisting of Ce, Ba, La, Ce, In, Sn, Ag, Sb, and oxides thereof.

In some embodiments, the metal nanoparticles have an average particle size between about 2 nm and about 5 nm. In some embodiments, the amount of metal nanoparticles in the resist composition ranges from about 0.5 wt. % to about 15 wt. % based on the weight of the nanoparticles and the solvent. In some embodiments, the amount of nanoparticles in the resist composition ranges from about 5 wt. % to about 10 wt. % based on the weight of the nanoparticles and the solvent. In some embodiments, the concentration of the metal particles ranges from 1 wt. % to 7 wt. % based on the weight of the solvent and the metal particles. Below about 0.5 wt. % metal nanoparticles, the resist coating is too thin. Above about 15 wt. % metal nanoparticles, the resist coating is too thick and viscous.

In some embodiments, the metallic core is complexed by a stable ligand, wherein the thermally stable ligand includes branched or unbranched, cyclic or non-cyclic, saturated organic groups, including C1-C7 alkyl groups or C1-C7 fluoroalkyl groups. The C1-C7 alkyl groups or C1-C7 fluoroalkyl groups include one or more substituents selected from the group consisting of —$CF_3$, —SH, —OH, =O, —S—, —P—, —$PO_2$, —C(=O)SH, —C(=O)OH, —C(=O)O—, —O—, —N—, —C(=O)NH, —$SO_2$OH, —$SO_2$SH, —SOH, and —$SO_2$—. In some embodiments, the ligand includes one or more substituents selected from the group consisting of —$CF_3$, —OH, —SH, and —C(=O) OH substituents.

In some embodiments, the ligand is a carboxylic acid or sulfonic acid ligand. For example, in some embodiments, the ligand is a methacrylic acid. In some embodiments, the metal particles are nanoparticles, and the metal nanoparticles are complexed with ligands including aliphatic or aromatic groups. The aliphatic or aromatic groups may be unbranched or branched with cyclic or noncyclic saturated pendant groups containing 1-9 carbons, including alkyl groups, alkenyl groups, and phenyl groups. The branched groups may be further substituted with oxygen or halogen. In some embodiments, each metal particle is complexed by 1 to 25 ligand units. In some embodiments, each metal particle is complexed by 3 to 18 ligand units.

In some embodiments, the resist composition includes about 0.1 wt. % to about 20 wt. % of the ligands based on the total weight of the resist composition. In some embodiments, the resist includes about 1 wt. % to about 10 wt. % of the ligands. In some embodiments, the ligand concentration is about 10 wt. % to about 40 wt. % based on the weight of the metal particles and the weight of the ligands. Below about 10 wt. %, ligand, the organometallic photoresist does not function well. Above about 40 wt. %, ligand, it is difficult to form a consistent photoresist layer. In some embodiments, the ligand(s) is dissolved at about a 5 wt. % to about 10 wt. % weight range in a coating solvent, such as propylene glycol methyl ether acetate (PGMEA) based on the weight of the ligand(s) and the solvent.

In some embodiments, the copolymers and the PACs, along with any desired additives or other agents, are added to the solvent for application. Once added, the mixture is then mixed in order to achieve a homogenous composition throughout the photoresist to ensure that there are no defects caused by uneven mixing or nonhomogeneous composition of the photoresist. Once mixed together, the photoresist may either be stored prior to its usage or used immediately.

The solvent can be any suitable solvent. In some embodiments, the solvent is one or more selected from propylene glycol methyl ether acetate (PGMEA), propylene glycol monomethyl ether (PGME), 1-ethoxy-2-propanol (PGEE), γ-butyrolactone (GBL), cyclohexanone (CHN), ethyl lactate (EL), methanol, ethanol, propanol, n-butanol, acetone, dimethylformamide (DMF), isopropanol (IPA), tetrahydrofuran (THF), methyl isobutyl carbinol (MIBC), n-butyl acetate (nBA), and 2-heptanone (MAK).

In some embodiments, the copolymer includes groups that can assist in increasing the adhesiveness of the photoresist layer 15 to underlying structures (e.g., substrate 10). Polar groups may be used to help increase the adhesiveness. Suitable polar groups include hydroxyl groups, cyano groups, or the like, although any suitable polar group may, alternatively, be used.

Some embodiments of the photoresist include one or more photoactive compounds (PACs). The PACs are photoactive components, such as photoacid generators (PAG), photobase (PBG) generators, photo decomposable bases (PDB), free-radical generators, or the like. The PACs may be positive-acting or negative-acting. In some embodiments in which the PACs are a photoacid generator, the PACs include halogenated triazines, onium salts, diazonium salts, aromatic diazonium salts, phosphonium salts, sulfonium salts, iodonium salts, imide sulfonate, oxime sulfonate, diazodisulfone, disulfone, o-nitrobenzylsulfonate, sulfonated esters, halogenated sulfonyloxy dicarboximides, diazodisulfones, α-cyanooxyamine-sulfonates, imidesulfonates, ketodiazosulfones, sulfonyldiazoesters, 1,2-di(arylsulfonyl)hydrazines, nitrobenzyl esters, and the s-triazine derivatives, combinations of these, or the like.

Specific examples of photoacid generators include α-(trifluoromethylsulfonyloxy)-bicyclo[2.2.1]hept-5-ene-2,3-dicarb-o-ximide (MDT), N-hydroxy-naphthalimide (DDSN), benzoin tosylate, t-butylphenyl-α-(p-toluenesulfonyloxy)-acetate and t-butyl-α-(p-toluenesulfonyloxy)-acetate, triarylsulfonium and diaryliodonium hexafluoroantimonates, hexafluoroarsenates, trifluoromethanesulfonates, iodonium perfluorooctanesulfonate, N-camphorsulfonyloxynaphthalimide, N-pentafluorophenylsulfonyloxynaphthalimide, ionic iodonium sulfonates such as diaryl iodonium (alkyl or aryl)sulfonate and bis-(di-t-butylphenyl)iodonium camphanylsulfonate, perfluoroalkanesulfonates such as perfluoropentanesulfonate, perfluorooctanesulfonate, perfluoromethanesulfonate, aryl (e.g., phenyl or benzyl)triflates such as triphenylsulfonium triflate or bis-(t-butylphenyl)iodonium triflate; pyrogallol derivatives (e.g., trimesylate of pyrogallol), trifluoromethanesulfonate esters of hydroxyimides, α,α'-bis-sulfonyl-diazomethanes, sulfonate esters of nitro-substituted benzyl alcohols, naphthoquinone-4-diazides, alkyl disulfones, or the like.

In some embodiments in which the PACs are free-radical generators, the PACs include n-phenylglycine; aromatic ketones, including benzophenone, N,N'-tetramethyl-4,4'-diaminobenzophenone, N,N'-tetraethyl-4,4'-diaminobenzophenone, 4-methoxy-4'-dimethylaminobenzo-phenone, 3,3'-dimethyl-4-methoxybenzophenone, p,p'-bis(dimethylamino)benzo-phenone, p,p'-bis(diethylamino)-benzophenone; anthraquinone, 2-ethylanthraquinone; naphthaquinone; and phenanthraquinone; benzoins including benzoin, benzoinmethylether, benzoinisopropylether, benzoin-n-butylether, benzoin-phenylether, methylbenzoin and ethylbenzoin; benzyl derivatives, including dibenzyl, benzyldiphenyldisulfide, and benzyldimethylketal; acridine derivatives, including 9-phenylacridine, and 1,7-bis(9-acridinyl)heptane; thioxanthones, including 2-chlorothioxanthone, 2-methylthioxanthone, 2,4-diethylthioxanthone, 2,4-dimethylthioxanthone, and 2-isopropylthioxanthone; acetophenones, including 1,1-dichloroacetophenone, p-t-butyldichloro-acetophenone, 2,2-diethoxyacetophenone, 2,2-dimethoxy-2-phenylacetophenone, and 2,2-dichloro-4-phenoxyacetophenone; 2,4,5-triarylimidazole dimers, including 2-(o-chlorophenyl)-4,5-diphenylimidazole dimer, 2-(o-chlorophenyl)-4,5-di-(m-methoxyphenyl imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer, 2,4-di(p-methoxyphenyl)-5-phenylimidazole dimer, 2-(2,4-dimethoxyphenyl)-4,5-diphenylimidazole dimer and 2-(p-methylmercaptophenyl)-4,5-diphenylimidazole dimmer; combinations of these, or the like.

As one of ordinary skill in the art will recognize, the chemical compounds listed herein are merely intended as illustrated examples of the PACs and are not intended to limit the embodiments to only those PACs specifically described. Rather, any suitable PAC may be used, and all such PACs are fully intended to be included within the scope of the present embodiments.

In some embodiments, a cross-linking agent is added to the photoresist. The cross-linking agent reacts with one group from one of the hydrocarbon structures in the polymer resin and also reacts with a second group from a separate one of the hydrocarbon structures in order to cross-link and bond the two hydrocarbon structures together. This bonding and cross-linking increases the molecular weight of the polymer products of the cross-linking reaction and increases the overall linking density of the photoresist. Such an increase in density and linking density helps to improve the resist pattern.

In some embodiments the cross-linking agent has the following structure:

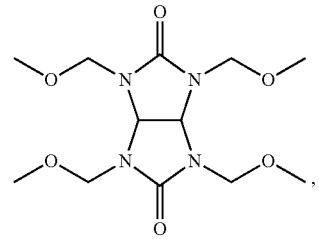

In other embodiments, the cross-linking agent has the following structure:

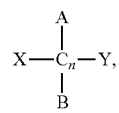

wherein C is carbon, n ranges from 1 to 15; A and B independently include a hydrogen atom, a hydroxyl group, a halide, an aromatic carbon ring, or a straight or cyclic alkyl, alkoxyl/fluoro, alkyl/fluoroalkoxyl chain having a carbon number of between 1 and 12, and each carbon C contains A and B; a first terminal carbon C at a first end of a carbon C chain includes X and a second terminal carbon C at a second end of the carbon chain includes Y, wherein X and Y independently include an amine group, a thiol group, a hydroxyl group, an isopropyl alcohol group, or an isopropyl amine group, except when n=1 then X and Y are bonded to the same carbon C. Specific examples of materials that may be used as the cross-linking agent include the following:

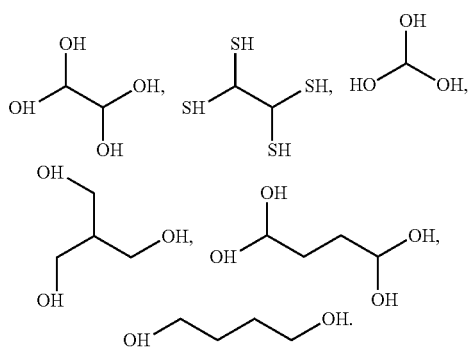
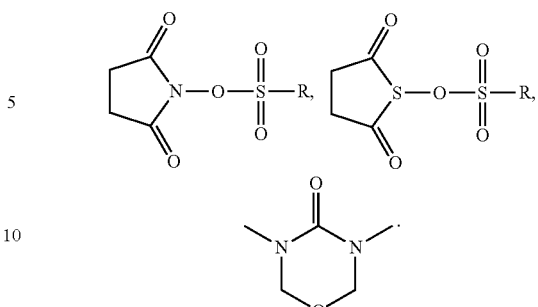

Alternatively, instead of or in addition to the cross-linking agent being added to the photoresist composition, a coupling reagent is added in some embodiments, in which the coupling reagent is added in addition to the cross-linking agent. The coupling reagent assists the cross-linking reaction by reacting with the groups on the hydrocarbon structure in the polymer resin before the cross-linking reagent, allowing for a reduction in the reaction energy of the cross-linking reaction and an increase in the rate of reaction. The bonded coupling reagent then reacts with the cross-linking agent, thereby coupling the cross-linking agent to the polymer resin.

Alternatively, in some embodiments in which the coupling reagent is added to the photoresist without the cross-linking agent, the coupling reagent is used to couple one group from one of the hydrocarbon structures in the polymer resin to a second group from a separate one of the hydrocarbon structures in order to cross-link and bond the two polymers together. However, in such an embodiment the coupling reagent, unlike the cross-linking agent, does not remain as part of the polymer, and only assists in bonding one hydrocarbon structure directly to another hydrocarbon structure.

In some embodiments, the coupling reagent has the following structure:

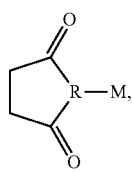

where R is a carbon atom, a nitrogen atom, a sulfur atom, or an oxygen atom; M includes a chlorine atom, a bromine atom, an iodine atom, —$NO_2$; —$SO_3$—; —H—; —CN; —NCO, —OCN; —$CO_2$—; —OH; —OR*, —OC(O)CR*; —SR, —$SO_2N(R^*)_2$; —$SO_2R^*$; SOR; —OC(O)R*; —C(O)OR*; —C(O)R*; —$Si(OR^*)_3$; —$Si(R^*)_3$; epoxy groups, or the like; and R* is a substituted or unsubstituted C1-C12 alkyl, C1-C12 aryl, C1-C12 aralkyl, or the like. Specific examples of materials used as the coupling reagent in some embodiments include the following:

The individual components of the photoresist are placed into a solvent in order to aid in the mixing and dispensing of the photoresist. To aid in the mixing and dispensing of the photoresist, the solvent is chosen at least in part based upon the materials chosen for the polymer resin as well as the PACs. In some embodiments, the solvent is chosen such that the polymer resin and the PACs can be evenly dissolved into the solvent and dispensed upon the layer to be patterned.

Another quencher is added to some embodiments of the photoresist composition to inhibit diffusion of the generated acids/bases/free radicals within the photoresist. The quencher improves the resist pattern configuration as well as the stability of the photoresist over time. In an embodiment, the quencher is an amine, such as a second lower aliphatic amine, a tertiary lower aliphatic amine, or the like. Specific examples of amines include trimethylamine, diethylamine, triethylamine, di-n-propylamine, tri-n-propylamine, tripentylamine, diethanolamine, and triethanolamine, alkanolamine, combinations thereof, or the like.

In some embodiments, an organic acid is used as the quencher. Specific embodiments of organic acids include malonic acid, citric acid, malic acid, succinic acid, benzoic acid, salicylic acid; phosphorous oxo acid and its derivatives, such as phosphoric acid and derivatives thereof such as its esters, phosphoric acid di-n-butyl ester and phosphoric acid diphenyl ester; phosphonic acid and derivatives thereof such as its ester, such as phosphonic acid dimethyl ester, phosphonic acid di-n-butyl ester, phenylphosphonic acid, phosphonic acid diphenyl ester, and phosphonic acid dibenzyl ester; and phosphinic acid and derivatives thereof such as its esters, including phenylphosphinic acid.

Another additive added to some embodiments of the photoresist is a stabilizer, which assists in preventing undesired diffusion of the acids generated during exposure of the photoresist. In some embodiments, the stabilizer includes nitrogenous compounds, including aliphatic primary, secondary, and tertiary amines; cyclic amines, including piperidines, pyrrolidines, morpholines; aromatic heterocycles, including pyridines, pyrimidines, purines; imines, including diazabicycloundecene, guanidines, imides, amides, or the like. Alternatively, ammonium salts are also be used for the stabilizer in some embodiments, including ammonium, primary, secondary, tertiary, and quaternary alkyl- and aryl-ammonium salts of alkoxides, including hydroxide, phenolates, carboxylates, aryl and alkyl sulfonates, sulfonamides, or the like. Other cationic nitrogenous compounds, including pyridinium salts and salts of other heterocyclic nitrogenous compounds with anions, such as alkoxides, including hydroxide, phenolates, carboxylates, aryl and alkyl sulfonates, sulfonamides, or the like, are used in some embodiments.

Another additive in some embodiments of the photoresist is a dissolution inhibitor to help control dissolution of the photoresist during development. In an embodiment bile-salt esters may be utilized as the dissolution inhibitor. Specific examples of dissolution inhibitors in some embodiments include cholic acid, deoxycholic acid, lithocholic acid, t-butyl deoxycholate, t-butyl lithocholate, and t-butyl-3-acetyl lithocholate.

Another additive in some embodiments of the photoresist is a plasticizer. Plasticizers may be used to reduce delamination and cracking between the photoresist and underlying layers (e.g., the layer to be patterned). Plasticizers include monomeric, oligomeric, and polymeric plasticizers, such as oligo- and polyethyleneglycol ethers, cycloaliphatic esters, and non-acid reactive steroidaly-derived materials. Specific examples of materials used for the plasticizer in some embodiments include dioctyl phthalate, didodecyl phthalate, triethylene glycol dicaprylate, dimethyl glycol phthalate, tricresyl phosphate, dioctyl adipate, dibutyl sebacate, triacetyl glycerine, or the like.

A coloring agent is another additive included in some embodiments of the photoresist. The coloring agent observers examine the photoresist and find any defects that may need to be remedied prior to further processing. In some embodiments, the coloring agent is a triarylmethane dye or a fine particle organic pigment. Specific examples of materials in some embodiments include crystal violet, methyl violet, ethyl violet, oil blue #603, Victoria Pure Blue BOH, malachite green, diamond green, phthalocyanine pigments, azo pigments, carbon black, titanium oxide, brilliant green dye (C. I. 42020), Victoria Pure Blue FGA (Linebrow), Victoria BO (Linebrow) (C. I. 42595), Victoria Blue BO (C. I. 44045), rhodamine 6G (C. I. 45160), benzophenone compounds, such as 2,4-dihydroxybenzophenone and 2,2', 4,4'-tetrahydroxybenzophenone; salicylic acid compounds, such as phenyl salicylate and 4-t-butylphenyl salicylate; phenylacrylate compounds, such as ethyl-2-cyano-3,3-diphenylacrylate, and 2'-ethylhexyl-2-cyano-3,3-diphenylacrylate; benzotriazole compounds, such as 2-(2-hydroxy-5-methylphenyl)-2H-benzotriazole, and 2-(3-t-butyl-2-hydroxy-5-methylphenyl)-5-chloro-2H-benzotriazole; coumarin compounds, such as 4-methyl-7-diethylamino-1-benzopyran-2-one; thioxanthone compounds, such as diethylthioxanthone; stilbene compounds, naphthalic acid compounds, azo dyes, phthalocyanine blue, phthalocyanine green, iodine green, Victoria blue, crystal violet, titanium oxide, naphthalene black, Photopia methyl violet, bromphenol blue and bromcresol green; laser dyes, such as Rhodamine G6, Coumarin 500, DCM (4-(dicyanomethylene)-2-methyl-6-(4-dimethylaminostyryl)-4H pyran)), Kiton Red 620, Pyrromethene 580, or the like. Additionally, one or more coloring agents may be used in combination to provide the desired coloring.

Adhesion additives are added to some embodiments of the photoresist to promote adhesion between the photoresist and an underlying layer upon which the photoresist has been applied (e.g., the layer to be patterned). In some embodiments, the adhesion additives include a silane compound with at least one reactive substituent such as a carboxyl group, a methacryloyl group, an isocyanate group and/or an epoxy group. Specific examples of the adhesion components include trimethoxysilyl benzoic acid, γ-methacryloxypropyl trimethoxy silane, vinyltriacetoxysilane, vinyltrimethoxysilane, γ-isocyanatepropyl triethoxy silane, γ-glycidoxypropyl trimethoxy silane, β-(3,4-epoxycyclohexyl)ethyl trimethoxy silane, benzimidazoles and polybenzimidazoles, a lower hydroxyalkyl substituted pyridine derivative, a nitrogen heterocyclic compound, urea, thiourea, an organophosphorus compound, 8-oxyquinoline, 4-hydroxypteridine and derivatives, 1,10-phenanthroline and derivatives, 2,2'-bipyridine and derivatives, benzotriazoles, organophosphorus compounds, phenylenediamine compounds, 2-amino-1-phenylethanol, N-phenylethanolamine, N-ethyldiethanolamine, N-ethylethanolamine and derivatives, benzothiazole, and a benzothiazoleamine salt having a cyclohexyl ring and a morpholine ring, 3-glycidoxypropyltrimethoxysilane, 3-glycidoxypropyltriethoxysilane, 3-mercaptopropyltrimethoxysilane, 3-mercaptopropyltriethoxysilane, 3-methacryloyloxypropyltrimethoxysilane, vinyl trimethoxysilane, combinations thereof, or the like.

Surface leveling agents are added to some embodiments of the photoresist to assist a top surface of the photoresist to be level, so that impinging light will not be adversely modified by an unlevel surface. In some embodiments, surface leveling agents include fluoroaliphatic esters, hydroxyl terminated fluorinated polyethers, fluorinated ethylene glycol polymers, silicones, acrylic polymer leveling agents, combinations thereof, or the like.

In some embodiments, the polymer resin and the PACs, along with any desired additives or other agents, are added to the solvent for application. Once added, the mixture is then mixed in order to achieve a homogenous composition throughout the photoresist to ensure that there are no defects caused by uneven mixing or nonhomogeneous composition of the photoresist. Once mixed together, the photoresist may either be stored prior to its usage or used immediately.

Once ready, the photoresist is applied onto the layer to be patterned, as shown in FIG. 2, such as the substrate 10 to form a photoresist layer 15. In some embodiments, the photoresist is applied using a process such as a spin-on coating process, a dip coating method, an air-knife coating method, a curtain coating method, a wire-bar coating method, a gravure coating method, a lamination method, an extrusion coating method, combinations of these, or the like. In some embodiments, the photoresist layer 15 thickness ranges from about 10 nm to about 300 nm.

After the photoresist layer 15 has been applied to the substrate 10, a pre-bake of the photoresist layer is performed in some embodiments to cure and dry the photoresist prior to radiation exposure (see FIG. 1). The curing and drying of the photoresist layer 15 removes the solvent component while leaving behind the polymer resin, the PACs, the cross-linking agent, and the other chosen additives. In some embodiments, the pre-baking is performed at a temperature suitable to evaporate the solvent, such as between about 50° C. and 120° C., although the precise temperature depends upon the materials chosen for the photoresist. The pre-baking is performed for a time sufficient to cure and dry the photoresist layer, such as between about 10 seconds to about 10 minutes.

FIGS. 3A and 3B illustrate selective exposures of the photoresist layer to form an exposed region 50 and an unexposed region 52. In some embodiments, the exposure to radiation is carried out by placing the photoresist coated substrate in a photolithography tool. The photolithography tool includes a photomask 30/65, optics, an exposure radiation source to provide the radiation 45/97 for exposure, and a movable stage for supporting and moving the substrate under the exposure radiation.

In some embodiments, the radiation source (not shown) supplies radiation 45, such as ultraviolet light, to the photoresist layer 15 in order to induce a reaction of the PACs, which in turn reacts with the polymer resin to chemically alter those regions of the photoresist layer to which the radiation 45 impinges. In some embodiments, the radiation is electromagnetic radiation, such as g-line (wavelength of about 436 nm), i-line (wavelength of about 365 nm), ultraviolet radiation, deep ultraviolet radiation, extreme ultraviolet, electron beams, or the like. In some embodiments, the radiation source is selected from the group consisting of a mercury vapor lamp, xenon lamp, carbon arc lamp, a KrF excimer laser light (wavelength of 248 nm), an ArF excimer laser light (wavelength of 193 nm), an $F_2$ excimer laser light (wavelength of 157 nm), or a $CO_2$ laser-excited Sn plasma (extreme ultraviolet, wavelength of 13.5 nm).

In some embodiments, optics (not shown) are used in the photolithography tool to expand, reflect, or otherwise control the radiation before or after the radiation 45/97 is patterned by the photomask 30/65. In some embodiments, the optics include one or more lenses, mirrors, filters, and combinations thereof to control the radiation 45/97 along its path.

In an embodiment, the patterned radiation 45 is deep ultraviolet light having a wavelength of less than 300 nm, the PAC is a photoacid generator, and a cross linking agent is used. The patterned radiation 45 impinges upon the photoacid generator, and the photoacid generator absorbs the impinging patterned radiation 45. This absorption initiates the photoacid generator to generate a proton (e.g., a $H^+$ atom) within the photoresist layer 15. When the proton impacts the carboxylic acid group on the hydrocarbon structure, the proton reacts with the carboxylic acid group, chemically altering the carboxylic acid group and altering the properties of the polymer resin in general. The carboxylic acid group then reacts with the cross-linking agent in some embodiments to cross-link with other polymer resins within the exposed region of the photoresist layer 15.

In some embodiments, the exposure of the photoresist layer 15 uses an immersion lithography technique. In such a technique, an immersion medium (not shown) is placed between the final optics and the photoresist layer, and the exposure radiation 45 passes through the immersion medium.

After the photoresist layer 15 has been exposed to the exposure radiation 45/97, a post-exposure baking is performed in some embodiments to assist in the generating, dispersing, and reacting of the acid/base/free radical generated from the impingement of the radiation 45 upon the PACs during the exposure by advancing a cross-linking reaction occurs in the exposed areas of the photoresist layer. In addition, cleavage of the R1 group or ring opening of the R2 groups also occurs in the actinic radiation unexposed areas, forming COOH groups during the post-exposure bake. The increased solubility of the COOH groups provides improved developing and less residue or scum in the developed areas of the photoresist. Such thermal assistance helps to create or enhance chemical reactions which generate chemical differences between the exposed region 50 and the unexposed region 52 within the photoresist layer 15. These chemical differences also cause differences in the solubility between the exposed region 50 and the unexposed region 52, thereby providing improved pattern definition and higher pattern resolution. In some embodiments, the post-exposure baking occurs at temperatures ranging from about 50° C. to about 160° C. for a period of between about 20 seconds and about 120 seconds.

The inclusion of the cross-linking agent into the chemical reactions helps the components of the polymer (e.g., the individual polymers) react and bond with each other, increasing the molecular weight of the bonded polymer in some embodiments. In particular, an initial polymer has a side chain with a carboxylic acid protected by one of the groups to be removed/acid labile groups. The groups to be removed are removed in a de-protecting reaction, which is initiated by a proton $H^+$ generated by, e.g., the photoacid generator during either the exposure process or during the post-exposure baking process. The $H^+$ first removes the groups to be removed/acid labile groups and another hydrogen atom may replace the removed structure to form a de-protected polymer. Once de-protected, a cross-linking reaction occurs between two separate de-protected polymers that have undergone the de-protecting reaction and the cross-linking agent in a cross-linking reaction. In particular, hydrogen atoms within the carboxylic groups formed by the de-protecting reaction are removed and the oxygen atoms react with and bond with the cross-linking agent. This bonding of the cross-linking agent to two polymers bonds the two polymers not only to the cross-linking agent but also bonds the two polymers to each other through the cross-linking agent, thereby forming a cross-linked polymer.

By increasing the molecular weight of the polymers through the cross-linking reaction, the new cross-linked polymer becomes less soluble in TMAH or conventional organic solvent negative resist developers.

In some embodiments, the photoresist developer 57 includes a solvent, and an acid or a base. In some embodiments, the concentration of the solvent is from about 60 wt. % to about 99 wt. % based on the total weight of the photoresist developer. The acid or base concentration is from about 0.001 wt. % to about 20 wt. % based on the total weight of the photoresist developer. In certain embodiments, the acid or base concentration in the developer is from about 0.01 wt. % to about 15 wt. % based on the total weight of the photoresist developer.

In some embodiments, the developer 57 is applied to the photoresist layer 15 using a spin-on process. In the spin-on process, the developer 57 is applied to the photoresist layer 15 from above the photoresist layer 15 while the photoresist-coated substrate is rotated, as shown in FIG. 4. In some embodiments, the developer 57 is supplied at a rate of between about 5 ml/min and about 800 ml/min, while the photoresist coated substrate 10 is rotated at a speed of between about 100 rpm and about 2000 rpm. In some embodiments, the developer is at a temperature of between about 10° C. and about 80° C. The development operation continues for between about 30 seconds to about 10 minutes in some embodiments.

While the spin-on operation is one suitable method for developing the photoresist layer 15 after exposure, it is intended to be illustrative and is not intended to limit the embodiment. Rather, any suitable development operations, including dip processes, puddle processes, and spray-on methods, may alternatively be used. All such development operations are included within the scope of the embodiments.

During the development process, the developer 57 dissolves the radiation-unexposed regions 52 of the cross-linked negative resist, exposing the surface of the substrate 10, as shown in FIG. 5, and leaving behind well-defined exposed photoresist regions 50, having improved definition than provided by conventional negative photoresist photolithography.

After the developing operation S150, remaining developer is removed from the patterned photoresist covered substrate. The remaining developer is removed using a spin-dry process in some embodiments, although any suitable removal technique may be used. After the photoresist layer 15 is developed, and the remaining developer is removed, additional processing is performed while the patterned photoresist layer 15 is in place. For example, an etching operation, using dry or wet etching, is performed in some embodiments, to transfer the pattern of the photoresist layer 50 to the underlying substrate 10, forming recesses 55' as shown in FIG. 6. The substrate 10 has a different etch resistance than the photoresist layer 15. In some embodiments, the etchant is more selective to the substrate 10 than the photoresist layer 15.

In some embodiments, the substrate 10 and the photoresist layer 15 contain at least one etching resistance molecule. In some embodiments, the etching resistant molecule includes a molecule having a low Onishi number structure, a double bond, a triple bond, silicon, silicon nitride, titanium, titanium nitride, aluminum, aluminum oxide, silicon oxynitride, combinations thereof, or the like.

Figure 8:
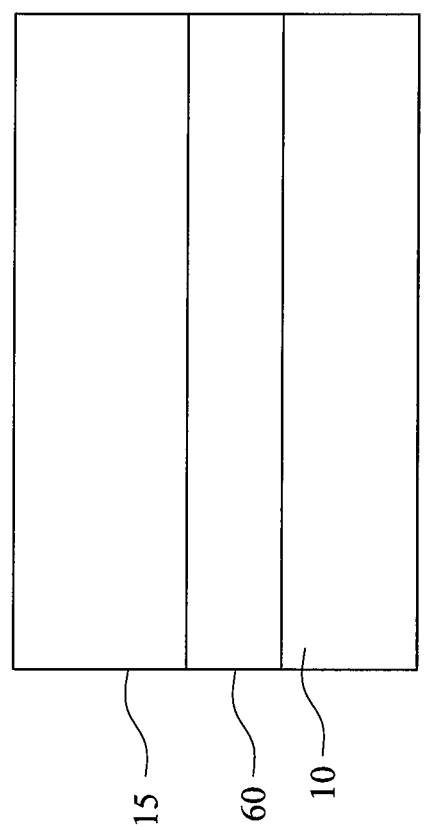
FIG. 8 shows a process stage of a sequential operation according to an embodiment of the disclosure.

In some embodiments, a layer to be patterned 60 is disposed over the substrate prior to forming the photoresist layer, as shown in FIG. 8. In some embodiments, the layer to be patterned 60 is a metallization layer or a dielectric layer, such as a passivation layer, disposed over a metallization layer. In embodiments where the layer to be patterned 60 is a metallization layer, the layer to be patterned 60 is formed of a conductive material using metallization processes, and metal deposition techniques, including chemical vapor deposition, atomic layer deposition, and physical vapor deposition (sputtering). Likewise, if the layer to be patterned 60 is a dielectric layer, the layer to be patterned 60 is formed by dielectric layer formation techniques, including thermal oxidation, chemical vapor deposition, atomic layer deposition, and physical vapor deposition.

Figure 9A:
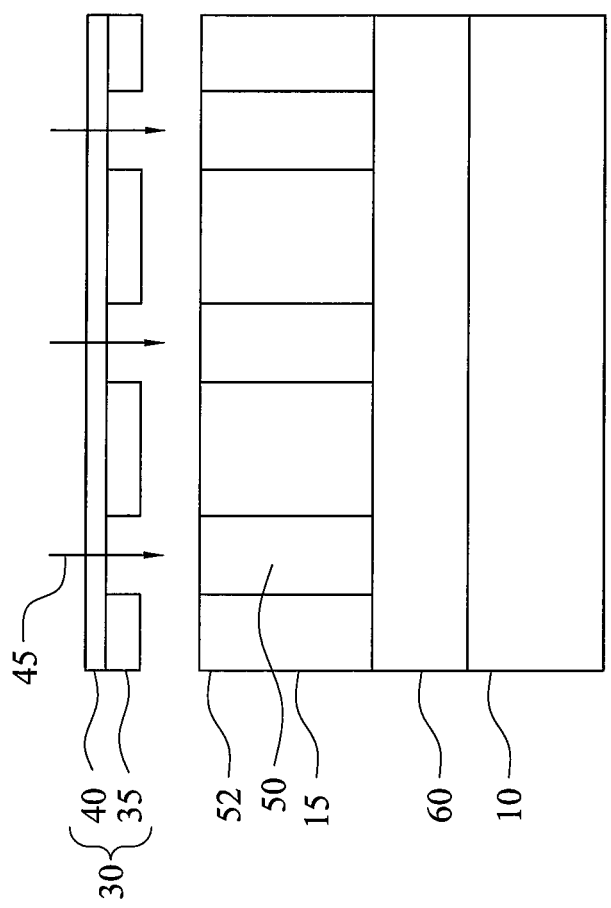
FIGS. 9A and 9B show a process stage of a sequential operation according to embodiments of the disclosure.
Figure 9B:
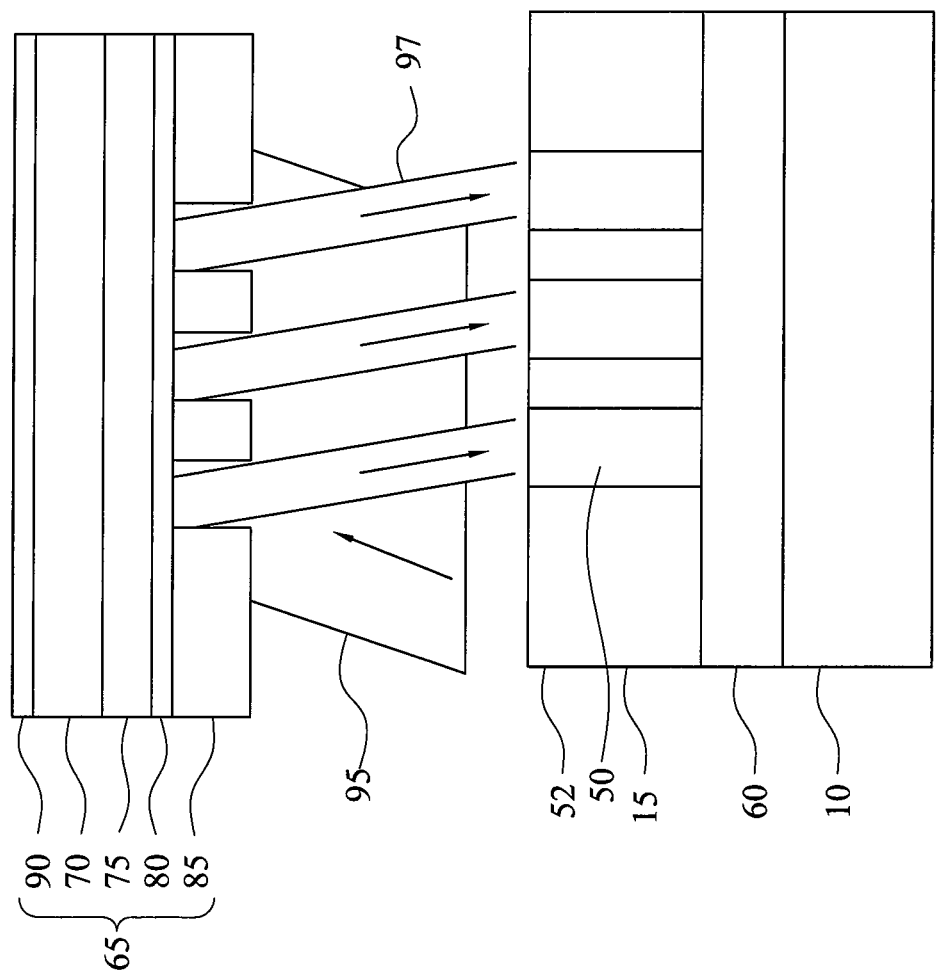

The photoresist layer 15 is subsequently selectively exposed to actinic radiation 45/97 to form exposed regions 50 and unexposed regions 52 in the photoresist layer, as shown in FIGS. 9A and 9B, and described herein in relation to FIGS. 3A and 3B. As explained herein the photoresist is a negative photoresist, wherein polymer crosslinking occurs in the exposed regions 50 in some embodiments.

Figure 11:
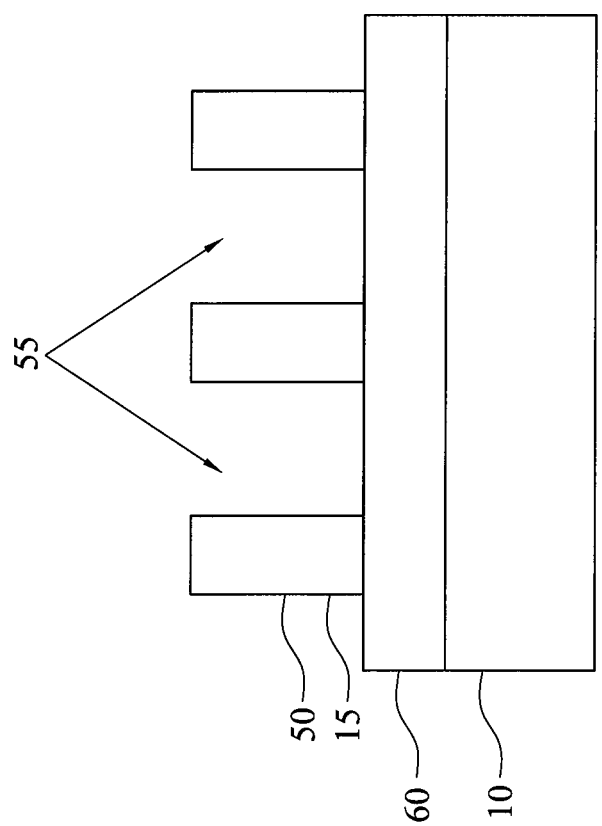
FIG. 11 shows a process stage of a sequential operation according to an embodiment of the disclosure.

As shown in FIG. 10, the unexposed photoresist regions 52 are developed by dispensing developer 57 from a dispenser 62 to form a pattern of photoresist openings 55, as shown in FIG. 11. The development operation is similar to that explained with reference to FIGS. 4 and 5, herein.

Figure 12:
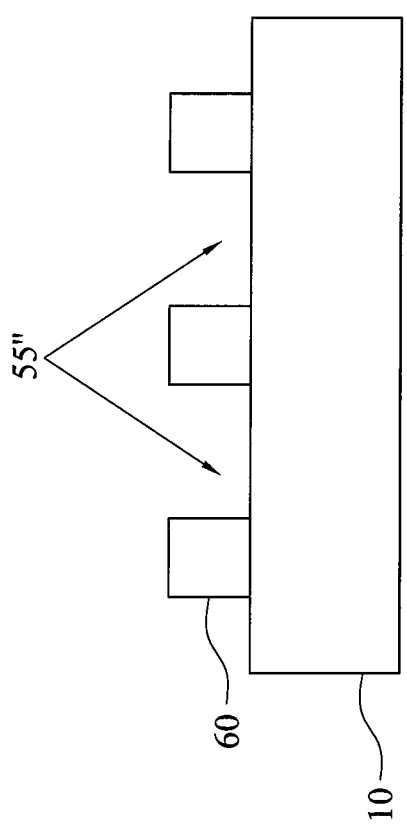
FIG. 12 shows a process stage of a sequential operation according to an embodiment of the disclosure.

Then as shown in FIG. 12, the pattern 55 in the photoresist layer 15 is transferred to the layer to be patterned 60 using an etching operation and the photoresist layer is removed, as explained with reference to FIG. 6 to form pattern 55" in the layer to be patterned 60.

Other embodiments include other operations before, during, or after the operations described above. In some embodiments, the disclosed methods include forming semiconductor devices, including fin field effect transistor (FinFET) structures. In some embodiments, a plurality of active fins are formed on the semiconductor substrate. Such embodiments, further include etching the substrate through the openings of a patterned hard mask to form trenches in the substrate; filling the trenches with a dielectric material; performing a chemical mechanical polishing (CMP) process to form shallow trench isolation (STI) features; and epitaxy growing or recessing the STI features to form fin-like active regions. In some embodiments, one or more gate electrodes are formed on the substrate. Some embodiments include forming gate spacers, doped source/drain regions, contacts for gate/source/drain features, etc. In other embodiments, a target pattern is formed as metal lines in a multilayer interconnection structure. For example, the metal lines may be formed in an inter-layer dielectric (ILD) layer of the substrate, which has been etched to form a plurality of trenches. The trenches may be filled with a conductive material, such as a metal; and the conductive material may be polished using a process such as chemical mechanical planarization (CMP) to expose the patterned ILD layer, thereby forming the metal lines in the ILD layer. The above are non-limiting examples of devices/structures that can be made and/or improved using the method described herein.

In some embodiments, active components such diodes, field-effect transistors (FETs), metal-oxide semiconductor field effect transistors (MOSFET), complementary metal-oxide semiconductor (CMOS) transistors, bipolar transistors, high voltage transistors, high frequency transistors, FinFETs, other three-dimensional (3D) FETs, metal-oxide semiconductor field effect transistors (MOSFET), complementary metal-oxide semiconductor (CMOS) transistors, bipolar transistors, high voltage transistors, high frequency transistors, other memory cells, and combinations thereof are formed, according to embodiments of the disclosure.

The novel photoresist compositions and photolithographic patterning methods according to the present disclosure provide higher semiconductor device feature resolution and density at higher wafer exposure throughput with reduced defects in a higher efficiency process than conventional exposure techniques. The novel photoresist compositions provide improved solubility of the photoresist components in the developer solution.

An embodiment of the disclosure is a method of manufacturing a semiconductor device, including forming a photoresist layer including a photoresist composition over a substrate. The photoresist layer is selectively exposed to actinic radiation, and the selectively exposed photoresist layer is developed. The photoresist composition includes a photoactive compound, a crosslinker, and a copolymer. The copolymer is

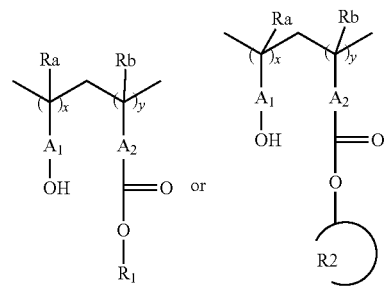

wherein A1 and A2 are independently a direct link, a C6-C15 phenyl group, a C7-C15 benzyl group, a C1-C15 alkyl group, a C3-C15 cycloalkyl group, a C1-C15 hydroxyalkyl group, a C2-C15 alkoxy group, a C3-C15 alkoxy alkyl group, a C2-C15 acetyl group, a C3-C15 acetyl alkyl group, a C1-C15 carboxyl group, a C2-C15 alkyl carboxyl group, a C4-C15 cycloalkyl carboxyl group, a C3-C15 saturated or unsaturated hydrocarbon ring, a C2-C15 hetero chain, a C3-C15 heterocyclic ring, or a substituted or unsubstituted three dimensional ring structure; R1 is thermal or acid labile group comprising a C4-C15 alkyl, a C4-C15 cycloalkyl, a C4-C15 hydroxyalkyl, a C4-C15 alkoxy, or a C4-C15 alkoxy alkyl group, or a substituted or unsubstituted three dimensional ring structure; R2 is a substituted or unsubstituted C4-C10 cycloalkyl group; Ra and Rb are independently H or $CH_3$; and $0<x/(x+y)<1$ and $0<y/(x+y)<1$. In an embodiment, the copolymer includes R1, and R1 is a substituted or unsubstituted adamantyl or norbornyl structure. In an embodiment, the crosslinker is

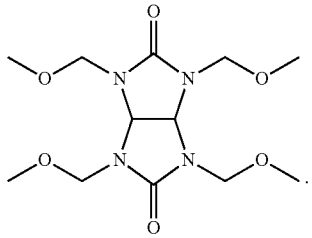

In an embodiment, the copolymer is selected from the group consisting of

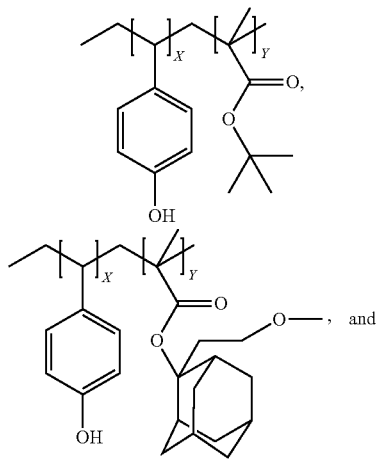

and

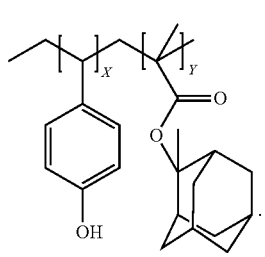

In an embodiment, the photoactive compound is a photoacid generator. In an embodiment, the actinic radiation is deep ultraviolet radiation. In an embodiment, the deep ultraviolet radiation is emitted by a KrF laser. In an embodiment, the method includes heating the selectively exposed photoresist layer at a temperature ranging from 50° ° C. to 160° C. before the developing. In an embodiment, the selective exposure to actinic radiation causes the photoactive compound to generate an acid that cleaves the R1 group or opens the R2 ring. In an embodiment, the crosslinker cross-links the copolymer at a site where the R1 group is cleaved or the R2 ring is opened.

Another embodiment of the disclosure is a method of manufacturing a semiconductor device, including forming a resist layer comprising a resist composition over a substrate. A latent pattern is formed in the resist layer. The latent pattern in the resist layer is developed. The resist composition includes a crosslinker and a copolymer. The copolymer is

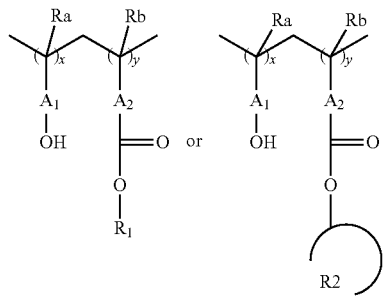

wherein A1 and A2 are independently a direct link, a C6-C15 phenyl group, a C7-C15 benzyl group, a C1-C15 alkyl group, a C3-C15 cycloalkyl group, a C1-C15 hydroxyalkyl group, a C2-C15 alkoxy group, a C3-C15 alkoxy alkyl group, a C2-C15 acetyl group, a C3-C15 acetyl alkyl group, a C1-C15 carboxyl group, a C2-C15 alkyl carboxyl group, a C4-C15 cycloalkyl carboxyl group, a C3-C15 saturated or unsaturated hydrocarbon ring, a C2-C15 hetero chain, a C3-C15 heterocyclic ring, or a substituted or unsubstituted three dimensional ring structure; R1 is thermal or acid labile group comprising a C4-C15 alkyl, a C4-C15 cycloalkyl, a C4-C15 hydroxyalkyl, a C4-C15 alkoxy, a C4-C15 alkoxy alkyl group, or a substituted or unsubstituted three dimensional ring structure; R2 is a substituted or unsubstituted C4-C10 cycloalkyl group; Ra and Rb are independently H or $CH_3$; and $0<x/(x+y)<1$ and $0<y/(x+y)<1$. In an embodiment, the method includes heating the resist layer at a temperature ranging from 40° C. to 160° C. before developing the latent pattern. In an embodiment, the copolymer includes R1, and R1 is a substituted or unsubstituted adamantyl or norbornyl structure. In an embodiment, the crosslinker is

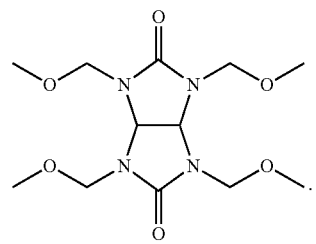

In an embodiment, the latent patent is formed by patternwise exposing the resist layer to radiation from a KrF laser.

Another embodiment of the disclosure is a photoresist composition including a photoactive compound, a crosslinker, and a copolymer. The copolymer is

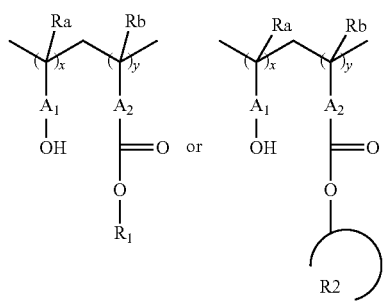

wherein A1 and A2 are independently a direct link, a C6-C15 phenyl group, a C7-C15 benzyl group, a C1-C15 alkyl group, a C3-C15 cycloalkyl group, a C1-C15 hydroxyalkyl group, a C2-C15 alkoxy group, a C3-C15 alkoxy alkyl group, a C2-C15 acetyl group, a C3-C15 acetyl alkyl group, a C1-C15 carboxyl group, a C2-C15 alkyl carboxyl group, a C4-C15 cycloalkyl carboxyl group, a C3-C15 saturated or unsaturated hydrocarbon ring, a C2-C15 hetero chain, a C3-C15 heterocyclic ring, or a substituted or unsubstituted three dimensional ring structure; R1 is thermal or acid labile group comprising a C4-C15 alkyl, a C4-C15 cycloalkyl, a C4-C15 hydroxyalkyl, a C4-C15 alkoxy, a C4-C15 alkoxy alkyl group, or a substituted or unsubstituted three dimensional ring structure; R2 is a substituted or unsubstituted C4-C10 cycloalkyl group; Ra and Rb are independently H or $CH_3$; and $0<x/(x+y)<1$ and $0<y/(x+y)<1$. In an embodiment, the copolymer includes R1, and R1 is a substituted or unsubstituted adamantyl or norbornyl structure. In an embodiment, the crosslinker is

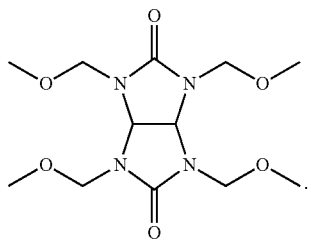

In an embodiment, the copolymer is selected from the group consisting of

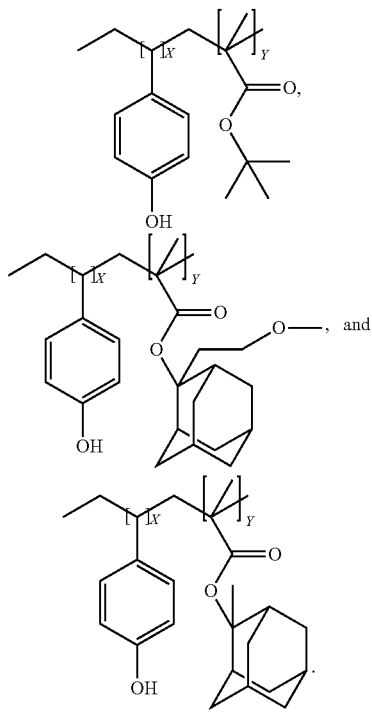

In an embodiment, the photoactive compound is a photoacid generator. In an embodiment, the photoresist composition includes a quencher. In an embodiment, the photoresist composition includes a solvent. In an embodiment, the photoactive compound is a photoacid generator. In an embodiment, R2 is a lactone.

Another embodiment of the disclosure is a method of manufacturing a semiconductor device, including forming a resist layer comprising a resist composition over a substrate. The resist layer is patternwise crosslinked, and an uncrosslinked portion of the resist layer is removed. In an embodiment, the resist composition includes a crosslinker and a copolymer. The copolymer is

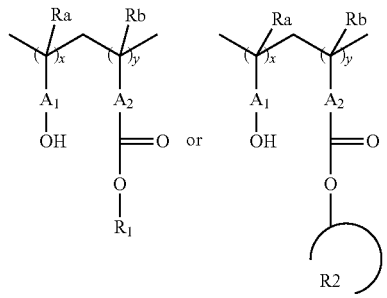

wherein A1 and A2 are independently a direct link, a C6-C15 phenyl group, a C7-C15 benzyl group, a C1-C15 alkyl group, a C3-C15 cycloalkyl group, a C1-C15 hydroxyalkyl group, a C2-C15 alkoxy group, a C3-C15 alkoxy alkyl group, a C2-C15 acetyl group, a C3-C15 acetyl alkyl group, a C1-C15 carboxyl group, a C2-C15 alkyl carboxyl group, a C4-C15 cycloalkyl carboxyl group, a C3-C15 saturated or unsaturated hydrocarbon ring, a C2-C15 hetero chain, a C3-C15 heterocyclic ring, a substituted or unsubstituted three dimensional ring structure; R1 is thermal or acid labile group comprising a C4-C15 alkyl, a C4-C15 cycloalkyl, a C4-C15 hydroxyalkyl, a C4-C15 alkoxy, a C4-C15 alkoxy alkyl group, or a substituted or unsubstituted three dimensional ring structure; R2 is a substituted or unsubstituted C4-C10 cycloalkyl group; Ra and Rb are independently H or $CH_3$; and $0<x/(x+y)<1$ and $0<y/(x+y)<1$. In an embodiment, the method includes heating the resist layer at a temperature ranging from 40° C. to 160° C. before removing the uncrosslinked portion of the resist layer. In an embodiment, the copolymer includes R1, and R1 is a substituted or unsubstituted adamantyl or norbornyl structure. In an embodiment, the copolymer includes R2, and R2 is a substituted or unsubstituted lactone. In an embodiment, the resist composition includes a photoacid generator. In an embodiment, the resist composition includes a quencher. In an embodiment, the resist composition includes a solvent. In an embodiment, during the patternwise crosslinking the resist layer, exposing the resist layer to deep ultraviolet radiation. In an embodiment, during the patternwise crosslinking the resist layer, exposing the resist layer to radiation from a KrF laser.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
   forming a photoresist layer comprising a photoresist composition over a substrate;
   selectively exposing the photoresist layer to actinic radiation; and
   developing the selectively exposed photoresist layer to remove regions of the photoresist layer not exposed to the actinic radiation,
   wherein the photoresist composition comprises:
   a photoactive compound;
   a crosslinker; and
   a copolymer,
   wherein the copolymer is made up of 95% or greater of repeating units a' and b'

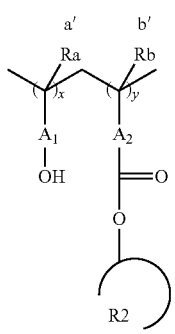

wherein A1 is a direct link, a C6-C15 phenyl group, a C7-C15 benzyl group, a C1-C15 alkyl group, a C3-C15 cycloalkyl group, a C1-C15 hydroxyalkyl group, a C2-C15 alkoxy group, a C3-C15 alkoxy alkyl group, a C2-C15 acetyl group, a C3-C15 acetyl alkyl group, a C1-C15 carboxyl group, a C2-C15 alkyl carboxyl group, a C4-C15 cycloalkyl carboxyl group, a C3-C15 saturated or unsaturated hydrocarbon ring, a C2-C15 hetero chain, a C3-C15 heterocyclic ring, or a substituted or unsubstituted three dimensional ring structure;
   A2 is a C6-C15 phenyl group, a C7-C15 benzyl group, a C1-C15 alkyl group, a C3-C15 cycloalkyl group, a C1-C15 hydroxyalkyl group, a C2-C15 alkoxy group, a C3-C15 alkoxy alkyl group, a C2-C15 acetyl group, a C3-C15 acetyl alkyl group, a C2-C15 alkyl carboxyl group, a C4-C15 cycloalkyl carboxyl group, a C3-C15 saturated or unsaturated hydrocarbon ring, a C2-C15 hetero chain, a C3-C15 heterocyclic ring, or a substituted or unsubstituted three dimensional ring structure;
   R2 is a C4-C10 lactone group substituted with a C1-C4 alcohol group;
   Ra and Rb are independently H or CH$_3$; and
   $0<x/(x+y)<1$ and $0<y/(x+y)<1$.

2. The method according to claim 1, wherein the crosslinker is

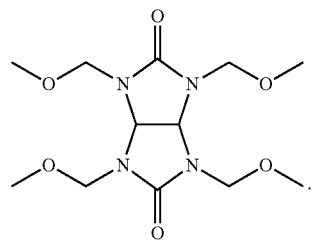

3. The method according to claim 1, wherein the photoactive compound is a photoacid generator.

4. The method according to claim 1, wherein the actinic radiation is deep ultraviolet radiation.

5. The method according to claim 4, wherein the deep ultraviolet radiation is emitted from a KrF laser.

6. The method according to claim 1, further comprising heating the selectively exposed photoresist layer at a temperature ranging from 50° C. to 160° C. before the developing.

7. The method according to claim 1, wherein the selective exposure to actinic radiation causes the photoactive compound to generate an acid that opens the R2 ring.

8. The method according to claim 7, wherein the crosslinker cross-links the copolymer at a site where the R2 ring is opened.

9. The method according to claim 1, wherein the lactone group is one or more selected from the group consisting of

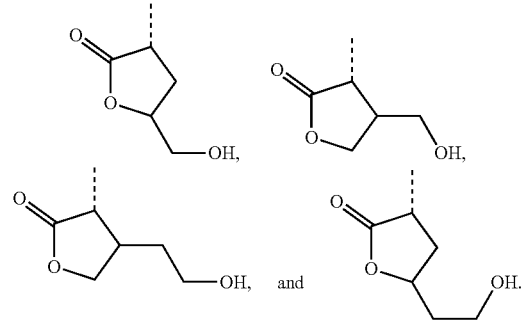

10. The method according to claim 1, wherein the developing the selectively exposed photoresist layer is performed using a developer having a pH >10.

11. A method of manufacturing a semiconductor device, comprising:
    forming a resist layer comprising a resist composition over a substrate;
    forming a latent pattern in the resist layer by exposing first regions of the resist layer to actinic radiation, wherein second regions of the resist layer are not exposed to the actinic radiation; and
    developing the latent pattern in the resist layer by removing the second regions of the photoresist layer,
    wherein the resist composition comprises:
    a crosslinker; and
    a copolymer,
    wherein the copolymer is made up of 95% or greater of repeating units a' and b'

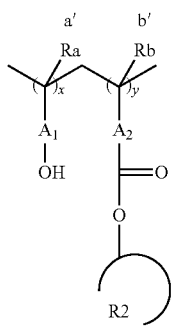

wherein A1 is a direct link, a C6-C15 phenyl group, a C7-C15 benzyl group, a C1-C15 alkyl group, a C3-C15 cycloalkyl group, a C1-C15 hydroxyalkyl group, a C2-C15 alkoxy group, a C3-C15 alkoxy alkyl group, a C2-C15 acetyl group, a C3-C15 acetyl alkyl group, a C1-C15 carboxyl group, a C2-C15 alkyl carboxyl group, a C4-C15 cycloalkyl carboxyl group, a C3-C15 saturated or unsaturated hydrocarbon ring, a C2-C15 hetero chain, a C3-C15 heterocyclic ring, or a substituted or unsubstituted three dimensional ring structure;

A2 is a C6-C15 phenyl group, a C7-C15 benzyl group, a C1-C15 alkyl group, a C3-C15 cycloalkyl group, a C1-C15 hydroxyalkyl group, a C2-C15 alkoxy group, a C3-C15 alkoxy alkyl group, a C2-C15 acetyl group, a C3-C15 acetyl alkyl group, a C2-C15 alkyl carboxyl group, a C4-C15 cycloalkyl carboxyl group, a C3-C15 saturated or unsaturated hydrocarbon ring, a C2-C15 hetero chain, a C3-C15 heterocyclic ring, or a substituted or unsubstituted three dimensional ring structure;

R2 is a C4-C10 lactone group substituted with a C1-C4 alcohol group;

Ra and Rb are independently H or CH$_3$; and $0 < x/(x+y) < 1$ and $0 < y/(x+y) < 1$.

12. The method according to claim 11, wherein the latent pattern is formed by patternwise exposing the resist layer to radiation from a KrF laser.

13. The method according to claim 11, further comprising heating the resist layer at a temperature ranging from 40° C. to 160° C. before developing the latent pattern.

14. The method according to claim 11, wherein the crosslinker is

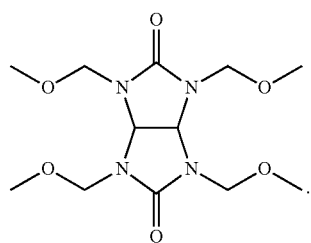

15. The method according to claim 11, wherein the lactone group is one or more selected from the group consisting of

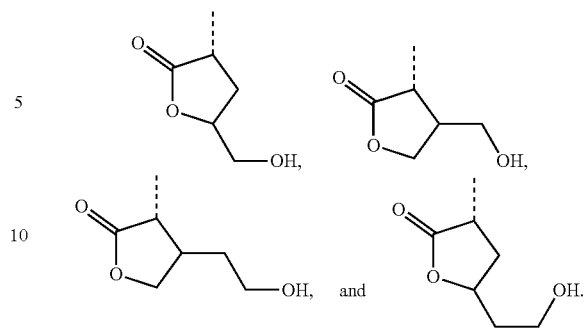

16. The method according to claim 11, wherein the developing the latent pattern in the resist layer is performed using a developer having a pH >10.

17. A photoresist composition, comprising:
a photoactive compound;
a crosslinker; and
a copolymer,
wherein the copolymer is made up of 95% or greater of repeating units a' and b'

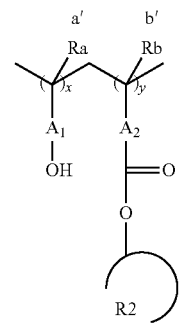

wherein A1 is a direct link, a C6-C15 phenyl group, a C7-C15 benzyl group, a C1-C15 alkyl group, a C3-C15 cycloalkyl group, a C1-C15 hydroxyalkyl group, a C2-C15 alkoxy group, a C3-C15 alkoxy alkyl group, a C2-C15 acetyl group, a C3-C15 acetyl alkyl group, a C1-C15 carboxyl group, a C2-C15 alkyl carboxyl group, a C4-C15 cycloalkyl carboxyl group, a C3-C15 saturated or unsaturated hydrocarbon ring, a C2-C15 hetero chain, a C3-C15 heterocyclic ring, or a substituted or unsubstituted three dimensional ring structure;

A2 is a C6-C15 phenyl group, a C7-C15 benzyl group, a C1-C15 alkyl group, a C3-C15 cycloalkyl group, a C1-C15 hydroxyalkyl group, a C2-C15 alkoxy group, a C3-C15 alkoxy alkyl group, a C2-C15 acetyl group, a C3-C15 acetyl alkyl group, a C2-C15 alkyl carboxyl group, a C4-C15 cycloalkyl carboxyl group, a C3-C15 saturated or unsaturated hydrocarbon ring, a C2-C15 hetero chain, a C3-C15 heterocyclic ring, or a substituted or unsubstituted three dimensional ring structure;

R2 is a C4-C10 lactone group substituted with a C1-C4 alcohol group;

Ra and Rb are independently H or CH$_3$; and $0 < x/(x+y) < 1$ and $0 < y/(x+y) < 1$, wherein the photoresist composition is a negative tone photoresist composition.

18. The photoresist composition of claim 17, wherein the photoactive compound is a photoacid generator.

19. The photoresist composition of claim 17, wherein the crosslinker is
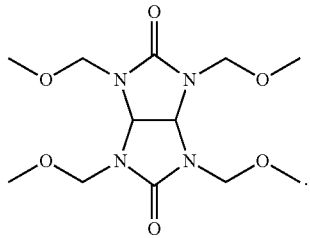
20. The photoresist composition according to claim 17, wherein the lactone group is one or more selected from the group consisting of
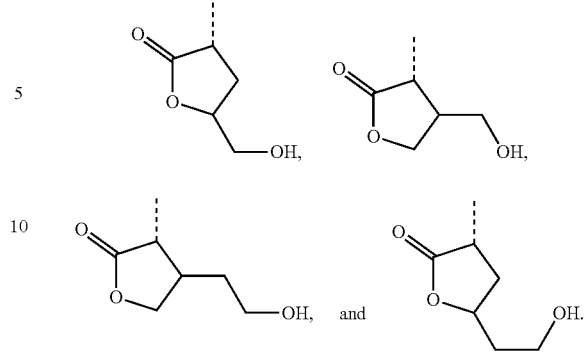
* * * * *